(12) United States Patent
Divsalar et al.

(10) Patent No.: US 7,343,539 B2
(45) Date of Patent: Mar. 11, 2008

(54) ARA TYPE PROTOGRAPH CODES

(75) Inventors: Dariush Divsalar, Pacific Palisades, CA (US); Aliazam Abbasfar, Cupertino, CA (US); Christopher R. Jones, Pacific Palisades, CA (US); Samuel J. Dolinar, Sunland, CA (US); Jeremy C. Thorpe, Redlands, CA (US); Kenneth S. Andrews, Pasadena, CA (US); Kung Yao, Sherman Oaks, CA (US)

(73) Assignee: The United States of America as represented by the United States National Aeronautics and Space Administration, Washington, DC (US)

( * ) Notice: Subject to any disclaimer, the term of this patent is extended or adjusted under 35 U.S.C. 154(b) by 431 days.

(21) Appl. No.: 11/166,040

(22) Filed: Jun. 24, 2005

(65) Prior Publication Data
US 2006/0294445 A1 Dec. 28, 2006

(51) Int. Cl.
*H03M 13/29* (2006.01)
(52) U.S. Cl. .................................... 714/755
(58) Field of Classification Search ............ 714/755
See application file for complete search history.

(56) References Cited

U.S. PATENT DOCUMENTS

| | | | | |
|---|---|---|---|---|
| 5,023,889 A | * | 6/1991 | Divsalar et al. ........... 375/244 |
| 5,729,560 A | * | 3/1998 | Hagenauer et al. ........ 714/786 |
| 5,734,962 A | * | 3/1998 | Hladik et al. .............. 714/755 |
| 6,014,411 A | * | 1/2000 | Wang ........................ 375/259 |
| 6,023,783 A | * | 2/2000 | Divsalar et al. ........... 714/792 |
| 6,560,362 B1 | * | 5/2003 | Piret et al. ................. 382/232 |
| 6,903,665 B2 | * | 6/2005 | Akhter et al. ................ 341/50 |
| 7,089,477 B1 | * | 8/2006 | Divsalar et al. ........... 714/755 |
| 7,093,179 B2 | * | 8/2006 | Shea .......................... 714/755 |
| 7,095,792 B2 | * | 8/2006 | Doetsch et al. ............ 375/265 |
| 7,158,589 B2 | * | 1/2007 | Cameron et al. ........... 375/341 |
| 7,191,376 B2 | * | 3/2007 | Yedidia ...................... 714/751 |
| 7,243,294 B1 | * | 7/2007 | Divsalar et al. ........... 714/792 |

* cited by examiner

*Primary Examiner*—Stephen M. Baker
(74) *Attorney, Agent, or Firm*—Ladas & Parry, LLP

(57) ABSTRACT

An apparatus and method for encoding low-density parity check codes. Together with a repeater, an interleaver and an accumulator, the apparatus comprises a precoder, thus forming accumulate-repeat-accumulate (ARA codes). Protographs representing various types of ARA codes, including AR3A, AR4A and ARJA codes, are described. High performance is obtained when compared to the performance of current repeat-accumulate (RA) or irregular-repeat-accumulate (IRA) codes.

38 Claims, 33 Drawing Sheets

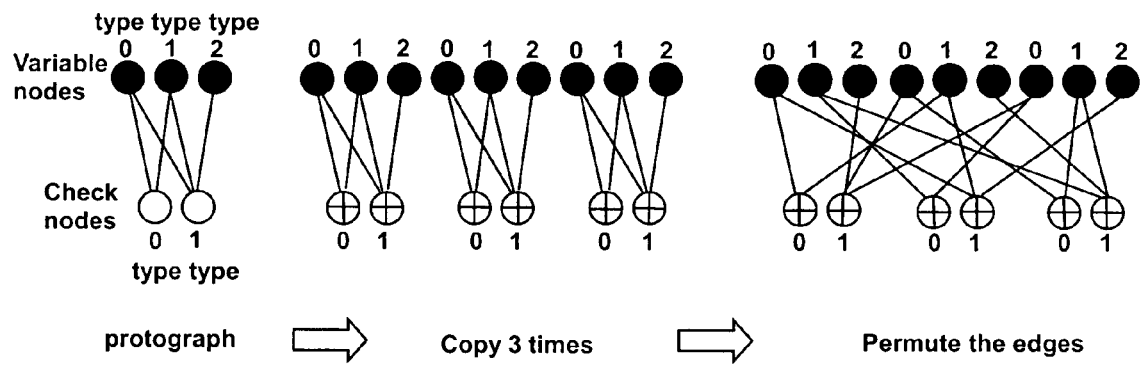
FIG. 1
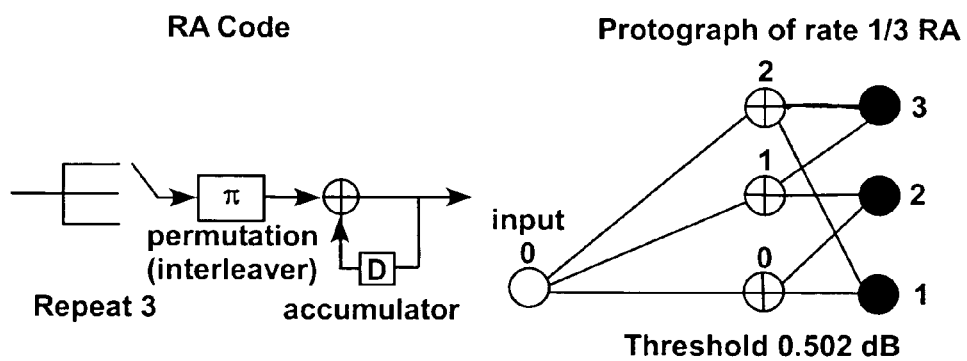
FIG. 2    FIG. 3

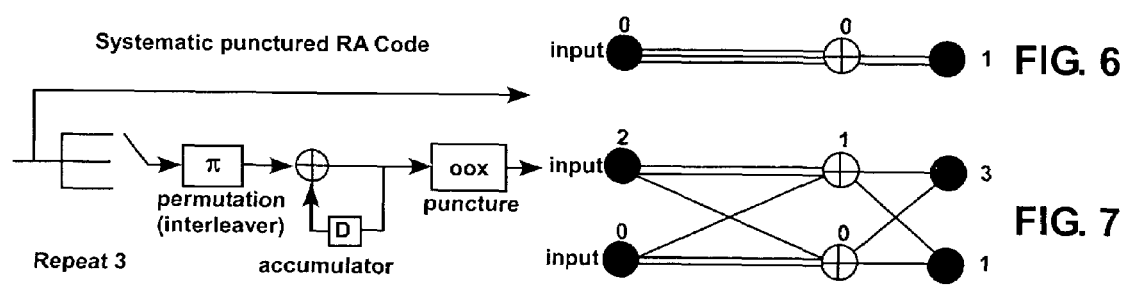
FIG. 5
FIG. 6
FIG. 7
Threshold 1.116.dB
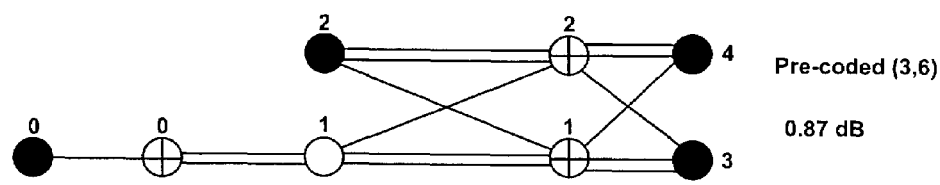
Pre-coded (3,6)
0.87 dB
FIG. 8

| Code Rate | Protograph Threshold | Capacity | Difference |
|---|---|---|---|
| 1/2 | 0.516 | 0.187 | 0.329 |
| 2/3 | 1.288 | 1.059 | 0.229 |
| 3/4 | 1.848 | 1.626 | 0.222 |
| 4/5 | 2.277 | 2.040 | 0.237 |
| 5/6 | 2.620 | 2.362 | 0.258 |
| 6/7 | 2.897 | 2.625 | 0.272 |
| 7/8 | 3.129 | 2.845 | 0.284 |

| Code Rate | Protograph Threshold | Capacity | Difference |
|---|---|---|---|
| 1/2 | 0.560 | 0.187 | 0.373 |
| 2/3 | 1.414 | 1.059 | 0.355 |
| 3/4 | 1.980 | 1.626 | 0.354 |
| 4/5 | 2.396 | 2.040 | 0.356 |
| 5/6 | 2.717 | 2.362 | 0.355 |
| 6/7 | 2.980 | 2.625 | 0.355 |
| 7/8 | 3.197 | 2.845 | 0.352 |

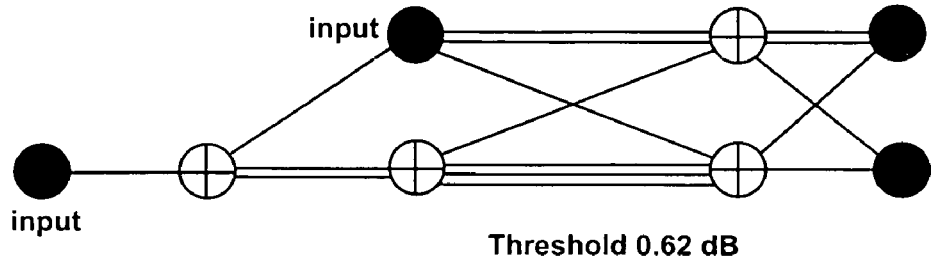
Threshold 0.62 dB
FIG. 15
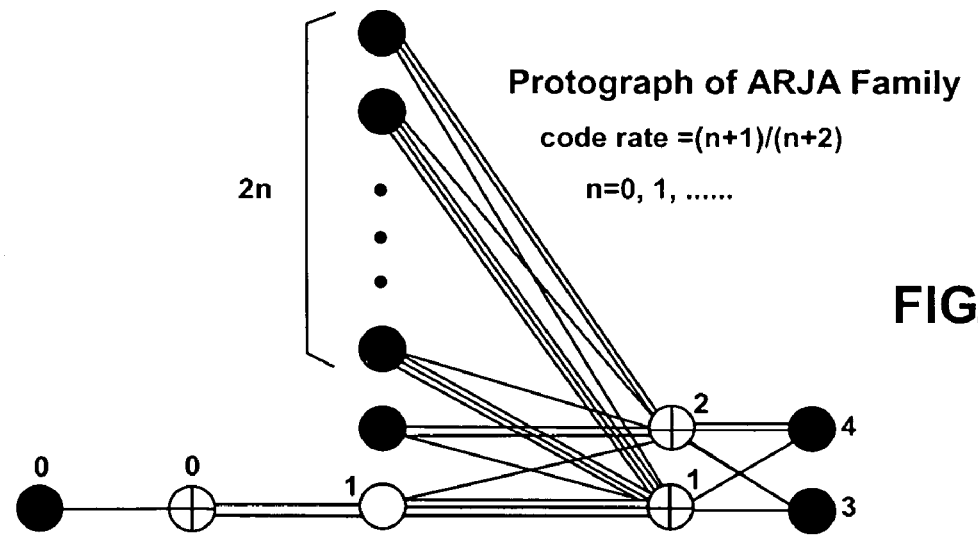
Protograph of ARJA Family
code rate =(n+1)/(n+2)
n=0, 1, ......
FIG. 16
| Code Rate | Protograph Threshold | Capacity | Difference |
|---|---|---|---|
| 1/2 | 0.628 | 0.187 | 0.441 |
| 2/3 | 1.400 | 1.059 | 0.341 |
| 3/4 | 1.958 | 1.626 | 0.332 |
| 4/5 | 2.372 | 2.040 | 0.332 |
| 5/6 | 2.693 | 2.362 | 0.331 |
| 6/7 | 2.956 | 2.625 | 0.331 |
| 7/8 | 3.173 | 2.845 | 0.328 |
FIG. 17

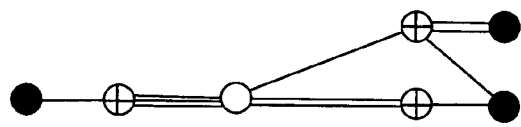
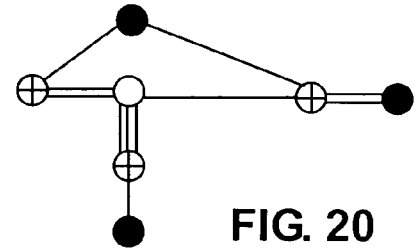
FIG. 19     FIG. 20
Threshold Eb/No=-0.326 dB
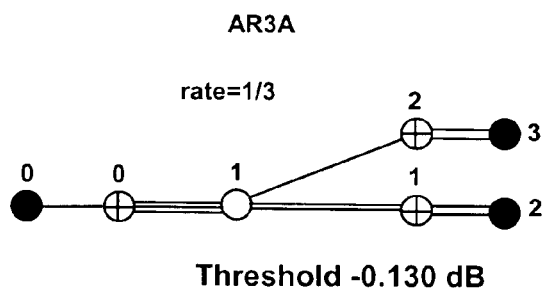
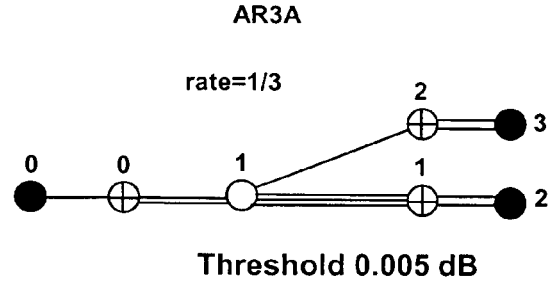
Threshold -0.130 dB     Threshold 0.005 dB
Capacity Threshold -0.495 dB
FIG. 21     FIG. 22

Threshold -0.818 dB

Capacity Threshold -1.073 dB

Threshold -0.816 dB

Threshold -0.980 dB

Capacity Threshold -1.206 dB

Threshold -0.928 dB

AR4A r=1/10

Threshold -1.028 dB

Capacity Threshold -1.285 dB

FIG. 31

ARJA rate=1/3

Threshold -0.021 dB

Capacity Threshold -0.495 dB

FIG. 32

Threshold -0.422 dB

Capacity Threshold= -0.794 dB

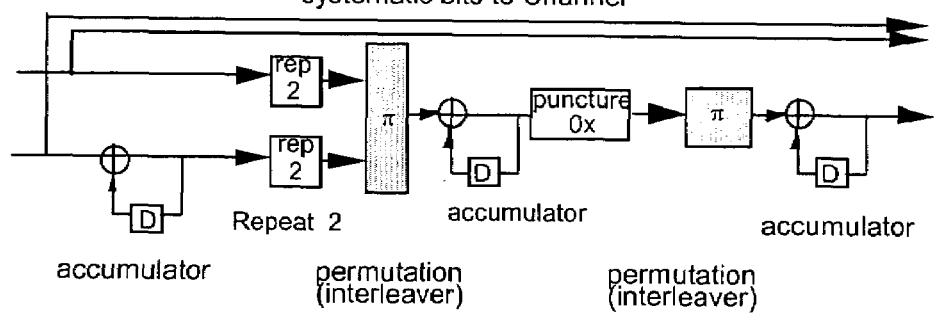
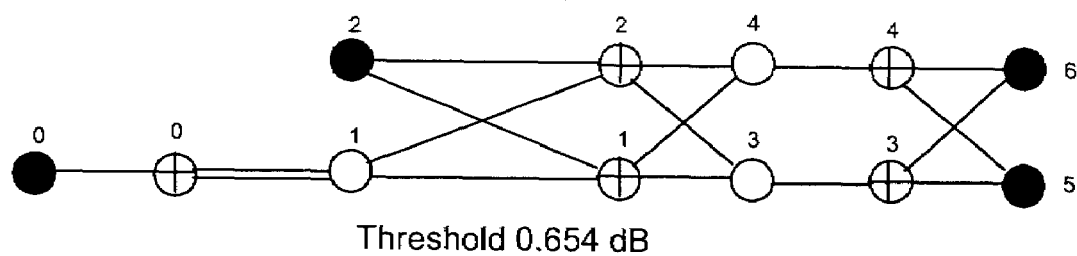
Threshold 0.654 dB
FIG. 35

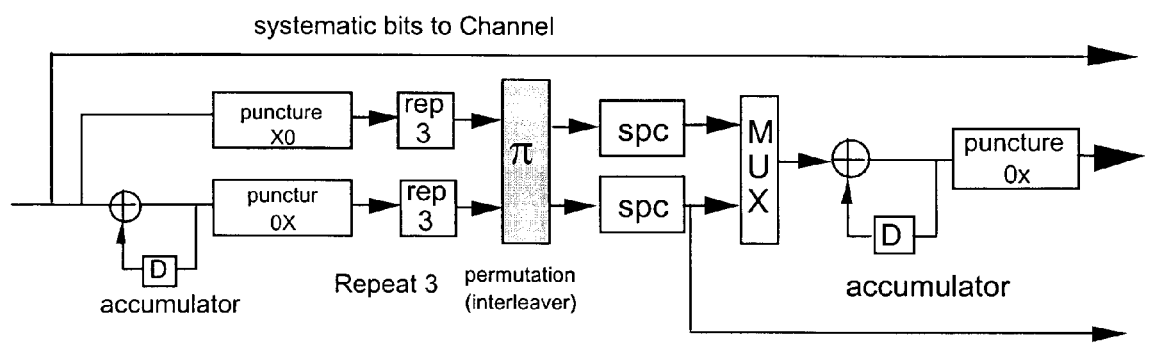
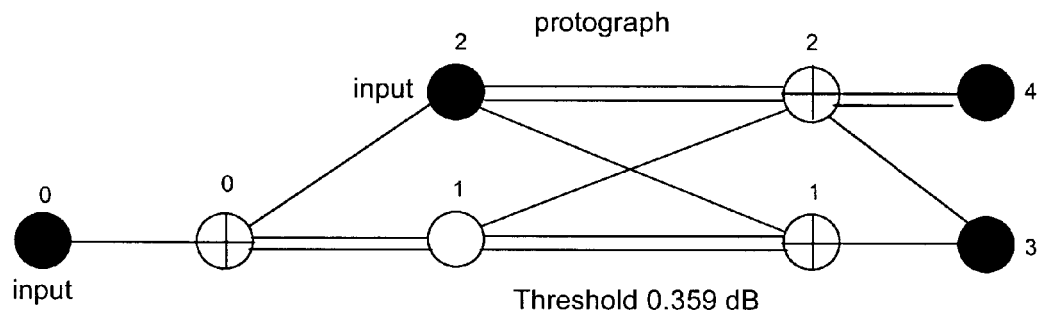
FIG. 40 protograph
of a rate 1/2 ARJA
with 5 checks

Iter. threshold= 0.490

$d_{min}$=0.004 x code block size

| Code Rate | Proto graph Threshold | Capacity Threshold | Differ -ence |
|---|---|---|---|
| 1/2 | 0.490 | 0.187 | 0.303 |
| 4/7 | 0.800 | 0.530 | 0.270 |
| 5/8 | 1.078 | 0.815 | 0.263 |
| 2/3 | 1.328 | 1.059 | 0.269 |
| 7/10 | 1.548 | 1.272 | 0.276 |
| 8/11 | 1.744 | 1.459 | 0.285 |
| 3/4 | 1.920 | 1.626 | 0.294 |
| 10/13 | 2.077 | 1.777 | 0.300 |
| 11/14 | 2.221 | 1.914 | 0.307 |
| 4/5 | 2.353 | 2.040 | 0.313 |
| 13/16 | 2.474 | 2.156 | 0.318 |
| 14/17 | 2.585 | 2.263 | 0.322 |
| 5/6 | 2.689 | 2.362 | 0.327 |
| 16/19 | 2.785 | 2.455 | 0.330 |
| 17/20 | 2.874 | 2.543 | 0.331 |
| 6/7 | 2.957 | 2.625 | 0.332 |
| 19/22 | 3.036 | 2.702 | 0.334 |
| 20/23 | 3.109 | 2.775 | 0.334 |
| 7/8 | 3.181 | 2.845 | 0.336 |
| 22/25 | 3.249 | 2.910 | 0.339 |
| 23/26 | 3.313 | 2.973 | 0.340 |
| 8/9 | 3.372 | 3.033 | 0.339 |

Code rate = $\frac{n+2}{n+5}$  n=1,2,......

More complex Accumulate-Repeat-Accumulate type codes

ARA TYPE PROTOGRAPH CODES

GOVERNMENT INTEREST

The invention described herein was made in the performance of work under a NASA contract, and is subject to the provisions of Public Law 96-517 (35 USC 202) in which the Contractor has elected to retain title.

CROSS-REFERENCE TO RELATED APPLICATIONS

This application is filed on the same day of of U.S. patent application Ser. No. 11/166,041, for "Encoders for Block-Circulant LDPC Codes," incorporated herein by reference in its entirety.

BACKGROUND

1. Field

The present disclosure includes methods and apparatus for the definition and the encoding of a specific class of forward error correcting (FEC) codes known as low-density parity-check (LDPC) codes.

2. Related Art

LDPC codes were invented by Gallager in 1961. The first graphical descriptions of forward error correcting codes were presented by Tanner in 1981. These descriptions became known as Tanner graphs. LDPC codes can be described with Tanner graphs. Tanner graphs can possess three distinct types of 'nodes': transmitted variable node, non-transmitted (or punctured) variable nodes, and constraint nodes. The remaining graph structure is defined by 'edges' that connect these three types of nodes together to form the final description of the code. Sub-structures whose replication ultimately defines the overall LDPC code are called 'protographs'. A protograph is a Tanner graph with a relatively small number of nodes.

As a simple example, the protograph shown in FIG. 1 can be considered. This graph consists of 3 variable nodes and 2 check nodes, connected by 5 edges.

A check or constraint node defines a parity check operation. In particular, a variable node pattern (a particular sequence of ones and zeros) is a codeword if and only if the modulo-2 sum of the edges impinging each check node is zero. The numbers in the figure enumerate the variable and check nodes.

A larger graph can be obtained by a 'copy-and-permute' operation as shown in FIG. 1. This operation consists of first making T copies of the protograph, and then permuting the endpoints of each edge among the T variable and T check nodes connected to the set of T edges copied from the same edge in the protograph. The derived graph is the graph of a code T times as large as the code corresponding to the protograph, with the same rate and the same distribution of variable and check node degrees.

A first type of prior art structure is embodied by the repeat-accumulate or RA code. In addition to being very simple, RA codes also have reasonably good performance.

In the remainder of the present disclosure, the performance of protograph codes will often be measured in terms of their 'asymptotic threshold' or simply 'threshold'. This threshold with be expressed in terms of a single signal-to-noise ratio (SNR). The threshold SNR of a protograph is the SNR for which it is possible for a code described by a set of infinite replications of the protograph to communicate with arbitrarily low error rate. In practice, infinite replication (parameter T) is not necessary for a code to achieve performance that approaches the threshold of the protograph. Therefore, threshold can be used as a practical comparative predictive measure of performance between codes that are based on differing protographs.

Threshold is equally often described in terms of an absolute SNR or in terms of a relative SNR gap to 'channel capacity'. Channel capacity was defined by Shannon in 1948 are for a given channel description and desired 'rate' of transmission defines the lowest possible SNR for which any code can provide reliable error-free communication. In the context of the present disclosure, the term 'rate' describes the fraction of a transmission that bears information.

The aforementioned RA codes achieve thresholds that are within 1 dB of capacity for rates less than or equal to ⅓. In other words, ⅓ of the transmission relays information and ⅔ relays a redundant description of the information. In the context of protograph codes, the redundant description is expressed in terms of 'parity' bits which are formed by simply linear combinations of information bits.

RA codes employ a fixed repetition of the input bits. As a simple example, the rate-⅓ Repeat-Accumulate (RA) code depicted in FIG. 2 can be considered. For this code the minimum Eb/No (SNR expressed in terms of energy per information bit) threshold with iterative decoding is 0.502 dB. This code has a protograph representation shown in FIG. 3, as long as the interleaver n is chosen to be decomposable into permutations along each edge of the protograph. Such an assumption is made for all interleavers (permutations) depicted in the figures of the present disclosure. The iterative decoding threshold is unchanged despite this constraint imposed by the protograph. The protograph consists of 4 variable nodes (3 transmitted and 1 punctured) and 3 check nodes, connected by 9 edges. Three variable nodes are connected to the channel and are shown as dark filled circles. One variable node is not connected to the channel (i.e., it is punctured) and is depicted by a blank circle. The three check nodes are depicted by circles with a plus sign inside.

Jin et al (H. Jin, A. Khandekar, and R. McEliece, "Irregular repeat-accumulate codes," in Proc. 2nd International Symposium on Turbo Codes, pp. 1-8, 2000) generalized the notion of RA codes by allowing irregular repetition of the input bits. An Irregular RA (IRA) code can be viewed as a serial concatenation of a simple low density generator matrix (LDGM) code with different degree variable nodes (irregular repetition) as an outer code, and an accumulator as an inner code. The encoder can be implemented by repetition codes, exclusive-OR's, and an accumulator as shown in FIG. 4.

A rate-½ classical RA code with a repetition-2 outer code has a high iterative decoding threshold of 3.01 dB. A much lower threshold of 1.116 dB was obtained by Abbasfar et al. (A. Abbasfar, D. Divsalar, and K. Yao, "Accumulate Repeat Accumulate Codes," ISIT 2004 and Globecom 2004, incorporated herein by reference in its entirety) for a rate-½ code using a modified RA construction as shown in FIG. 5. Here the outer code has repetition 3 or 4, the systematic bits are transmitted, and the accumulator code is punctured to make the overall rate ½. With suitable definitions of the interleaver π, the systematic punctured RA code can be represented by various protographs that yield the same threshold, as illustrated in FIGS. 6 and 7. The protograph of FIG. 7 can be modified to realize protographs such as those shown in FIG. 10, a possible encoder for which is shown in FIG. 9. Puncturing an accumulator means that the output stream from the accumulator has certain nodes not transmitted. For instance, the pattern 00X implies that, in a repeating period-3 pattern, the first two bits are not transmitted and the last bit is passed through the channel.

For Irregular.-Repeat-Accumulate (IRA) codes the node degree distribution can be optimized to achieve low thresholds. However, to achieve a very low threshold, the maximum repetition for some portion of the input bits can be very high. Similar requirements on the maximum variable node degree were noted for a general (non-protograph based) irregular LDPC codes (T. Richardson, A. Shokrollahi, and R. Urbanke, "Design of capacity approaching irregular low-density parity-check codes," IEEE Trans. Inform. Theory, vol. 47, pp. 619-637, 2001) to achieve very low thresholds.

SUMMARY

According to a first aspect, an apparatus for linear error correcting codes is disclosed, comprising: a precoder to precode one or more input bits; a repeater to repeat precoded bits for a plurality of times, forming a plurality of bits; an interleaver to permute the plurality of bits to form permuted bits; and a first accumulator to sum the permuted bits.

According to a second aspect, a digital communication encoding method is disclosed, comprising: providing one or more bits; precoding the one or more bits; repeating each precoded bit for a plurality of times, forming a plurality of bits; permuting the plurality of bits to form permuted bits; and transmitting an accumulated sum of the permuted bits. The precoder, in general, can be a low density generator matrix (LDGM) code. Special cases of such precoders can be accumulators or differentiators, or other structures with degree one nodes as shown in FIGS. 19-33 (where liberal use of precoding was used to construct low rate codes).

BRIEF DESCRIPTION OF THE DRAWINGS

FIG. 1 shows an example of a copy and permute operation to generate larger graphs.

FIG. 2 shows a rate-⅓ RA code with repetition 3.

FIG. 3 shows the protograph of the code of FIG. 2.

FIG. 5 shows a systematic punctured RA code.

FIGS. 6 and 7 show two possible representations by protographs of the code of FIG. 5.

FIG. 8 shows, in protograph format, a precoded version of a regular (3, 6) code where the precoding has yielded an improved threshold.

FIG. 11 shows an ARA-3 family with rates ½ and higher.

FIG. 15 shows a rate-½ ARJA code and its protograph.

FIGS. 16 and 17 show a protograph of an ARJA family with rates ½ and higher.

FIGS. 19 and 20 show low-threshold rate-⅓ protographs.

FIGS. 21 and 22 show rate-⅓ AR3A and AR4A protographs.

FIG. 31 shows a rate 1/10 AR4A protograph.

FIG. 32 shows a rate-⅓ ARJA protograph.

FIG. 35 shows concatenation of an accumulator as inner code with an ARA with repetition 2 as an outer code and a corresponding protograph.

FIG. 40 shows rate ½ Accumulate Repeat Check Accumulate (ARCA) codes with repetition 3 and the corresponding protograph.

In FIG. 48 also the corresponding protograph is shown, where a more general LDGM code is used as precoder.

FIG. 49 also shows the corresponding protograph where a more general LDGM code (repeat 3, interleaver, and single parity check code) is used as the precoder.

In FIG. 50, the inner accumulator in the ARA type code was replaced by a memory 2 accumulator (which can also be considered as a rate-1, 4-state convolutional code). In FIG. 51, a memory 2 accumulator represent the precoder. In FIG. 52, both the inner accumulator and the precoder in the ARA type code use memory 2 accumulators as the inner accumulator and the precoder.

DETAILED DESCRIPTION

Figure 4:
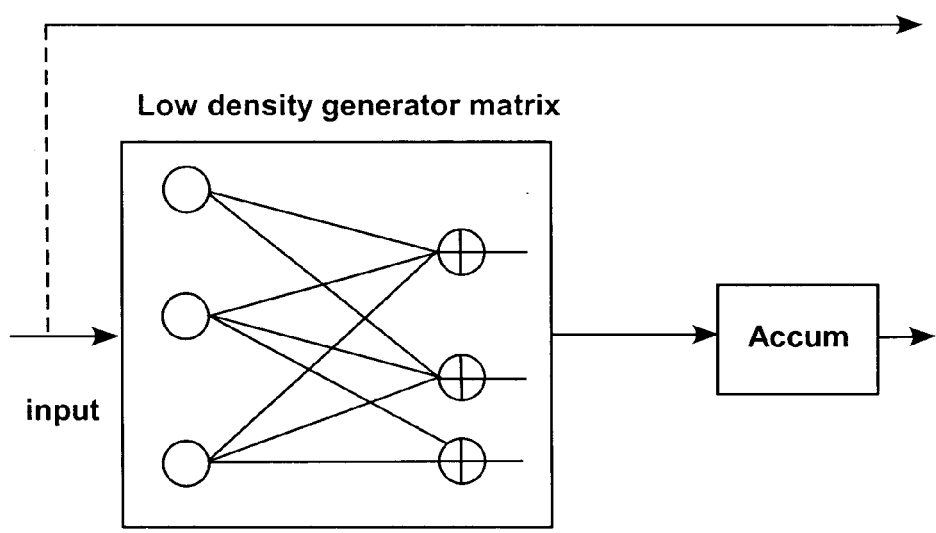
FIG. 4 shows the structure of an IRA code.

Throughout the description of the present disclosure, reference will be made to the enclosed Annex A, which makes part of the present disclosure.

Accumulate-Repeat-Accumulate (ARA codes) can achieve very low thresholds (e.g., within 0.08 dB from the capacity limit for rate-½ codes) with variable and check nodes of low maximum degree, usually 5 or 6.

As already described above, FIG. 5 shows a rate-½ systematic punctured RA code with repetition 3, and puncturing period 3. The applicants (A. Abbasfar, D. Divsalar, and K. Yao, "Accumulate Repeat Accumulate Codes," ISIT 2004 and Globecom 2004, incorporated herein by reference in its entirety) showed that the threshold can be further improved by 'precoding' the repetition code with an accumulator, but precoding is not specific to an accumulator and, in general, an LDGM code can be used.

In the context of FIG. 5, precoding implies single memory recursive feedback with binary addition. In general, however, precoding implies that the protograph of a given code have one variable node punctured (to maintain rate, or not punctured to lower rate) and concatenated with any low density generator matrix code (that has a Tanner graph containing at least one degree one node).

A regular code has the same number of edges emanating from each variable node and the same number entering each check node. FIG. 8 shows the precoded version of the (3,6) regular LDPC code, i.e. a code where 3 edges leave each variable node and six edges enter each check node. This regular code, which is precoded by a simple accumulator, exhibits a threshold improvement of 0.2 dB and also has improved minimum distance at a given block length as compared to the standard (3,6) regular LDPC code.

Figures 9, 10:
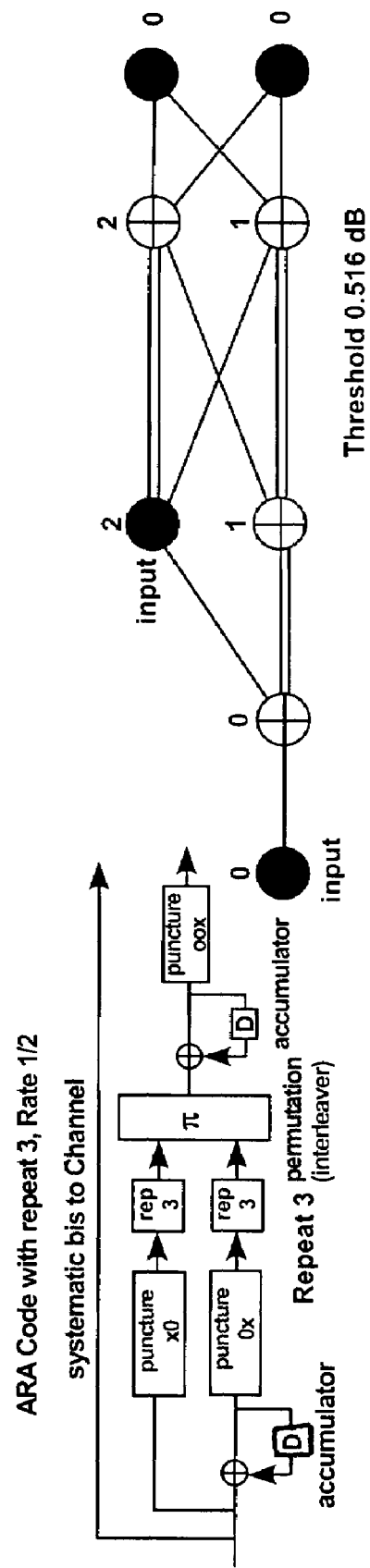
FIGS. 9 and 10 show a rate-½ accumulate-repeat-accumulate (ARA) code and its protograph.

An RA code with an accumulator precoder is called an Accumulate-Repeat-Accumulate (ARA) code. An example of a simple rate-½ ARA code, its protograph, a possible encoder, and the corresponding threshold are shown in FIGS. 9 and 10. The ARA encoder in FIG. 9 uses a punctured accumulator as the precoder.

Annex A, enclosed with the present description, shows equivalency between serial-concatenated-code (SCC) constructions and protographs.

The replication process that a protograph undergoes when it is copied T times is called 'lifting'. A lifting procedure is concerned primarily with how edges are interconnected between protograph copies. The protograph structure itself dictates the set of nodes that a given edge can be connected between.

Structured decoders exploit this property as a feature and use it to reduce the overall amount of memory required to describe the final (lifted) version of the code. In general, many decoding schedules as well as different manifestations of check and variable node processing can be used to decode a codeword that has been corrupt with noise. The most common schedule arranges the nodes into a two part, or bipartite, graph such that all variable nodes appear on the left hand side of the graph and all check nodes appear on the right.

Given an observation of a codeword (usually along with assumption regarding the type of channel that the codeword has been transmitted through) messages are passed successively between variable nodes and constraint nodes in the graph. Computations are applied on each side of the graph such that information from other side (or opposite node type) is used to construct a new outgoing message that is by some measure an improvement as compared to the message that was generated in the prior iteration. The passing of messages from the left side to the right side of the graph continues until either a codeword is found (all check constraints sum to zero) or a maximum number of iterations has been performed.

In the following paragraphs, two rate ½ and higher families of protograph codes will be described.

Figures 11, 12:
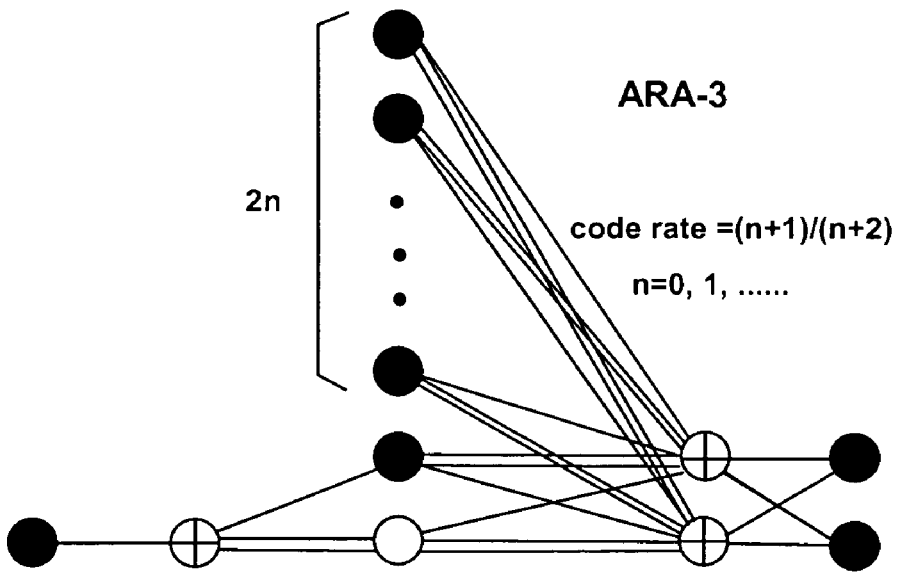
FIGS. 11 and 12 shows an ARA-3 family of codes. The term family implies that the presented protograph structure can be used to achieve various code rates.
Figures 13, 14:
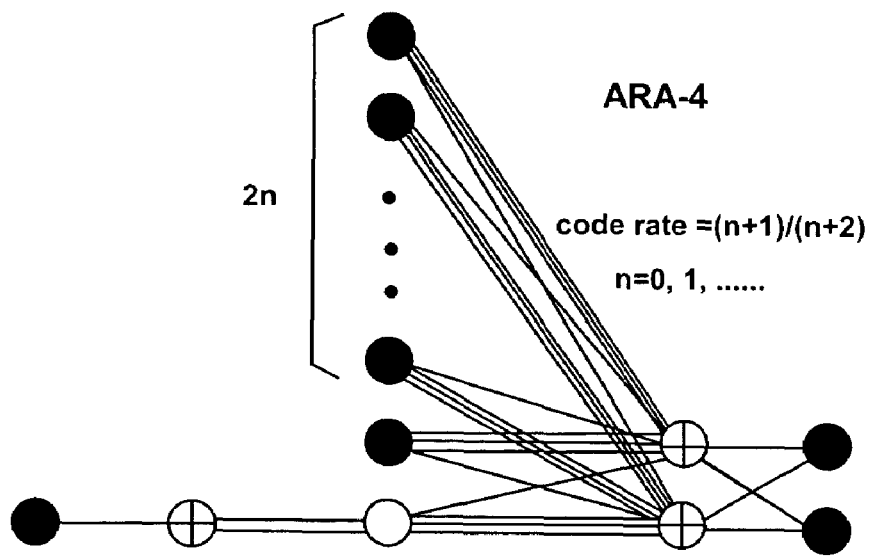
FIGS. 13 and 14 show an ARA-4 family of codes.

FIGS. 11 and 13 show ARA codes with repetition 3 and 4, respectively. The figures show protographs for 'families' of ARA-3 (or AR3A) and ARA-4 (or AR4A) codes with rates ½ and higher. In other words, the protograph structure of FIG. 11 is similar to the protograph structure of FIG. 10, in the sense that the code rate is parametric. Further, in the protograph structure of FIG. 13, each variable node is repeated four times instead of three. The corresponding thresholds for the codes are also given in the tables shown in FIGS. 12 and 14.

As shown in FIGS. 12 and 14, Accumulate Repeat Accumulate (ARA) codes have good thresholds. However, another measure, their asymptotic ensemble minimum distance, does not grow with code blocklength. Minimum distance is a measure that can dominate code performance at relatively high SNRs. As such, protograph codes that yield a family that on the average possess a minimum distance that grows as the number of protograph replications (T) (or blocklength) increases would yield better performance at high SNR than a code family that did not possess this property.

In an ARA code protograph the number of degree 2 variable nodes is equal to the number of inner checks (checks that are connected to these degree 2 variable nodes). If the number of degree 2 variable nodes is decreased with respect to inner checks, then the ensemble asymptotic minimum distance of code may grow with blocklength. For example if 50% of degree 2 variable nodes are replaced with degree 3 variable nodes, then the minimum distance grows with blocklength. The applicants have called such constructed codes ARJA (Accumulate-Repeat-Jagged-Accumulate) codes.

FIG. 15 shows an example of a simple rate-½ ARJA code, its protograph, and the corresponding threshold.

FIG. 16 shows an ARJA code family (based on the rate ½ code of FIG. 15) for rates ½ and higher. This ARJA code family uses an accumulator as the precoder. The higher code rates are constructed by using repetition codes (3 and 4) for a portion of the input bits and then adding permuted versions of the repetition to the 'jagged' accumulator structure on the right-hand side of the protograph. The thresholds achieved by the family compared to the corresponding capacity limits are also shown in the table of FIG. 17.

Figure 18:
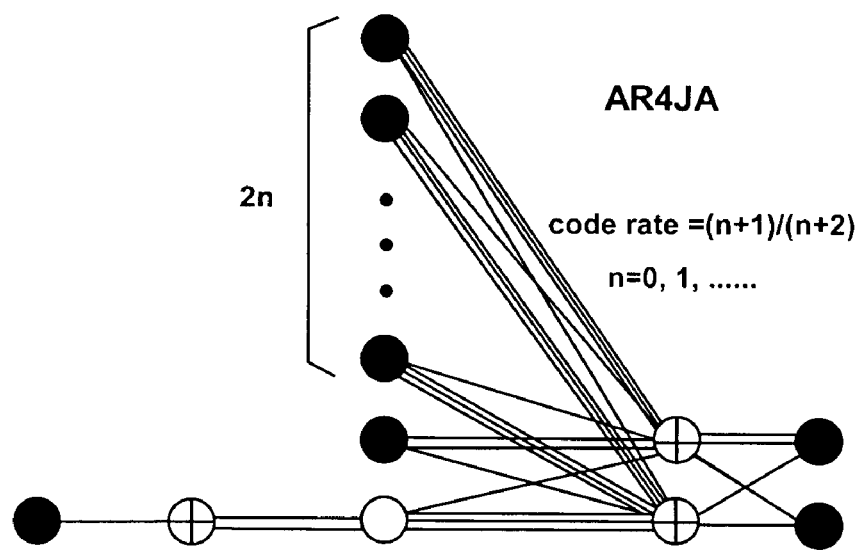
FIG. 18 shows an AR4JA protograph that constructs a family of codes for rates ½ and higher.
Figure 23:
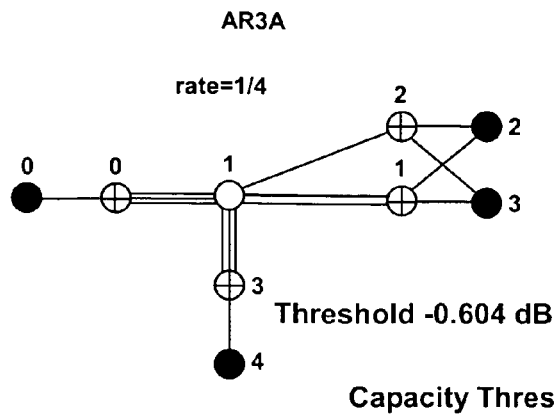
FIGS. 23 and 24 show rate-¼ AR3A and AR4A protographs.
Figure 24:
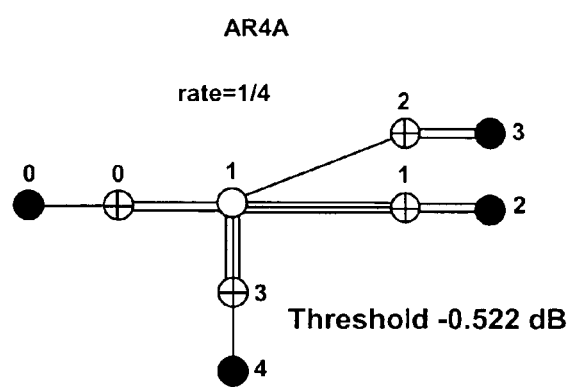
Figure 25:
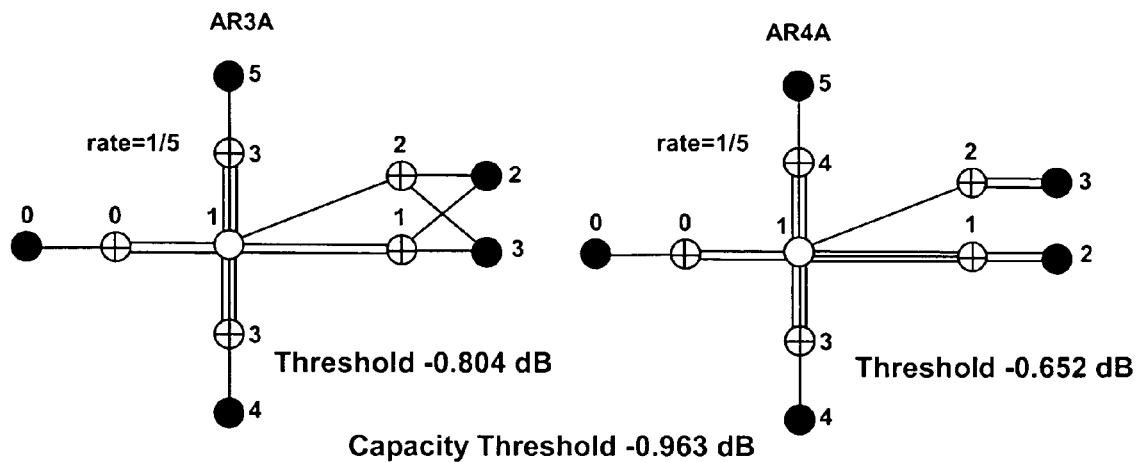
FIGS. 25 and 26 show rate-⅕ AR3A and AR4A protographs.
Figure 26:
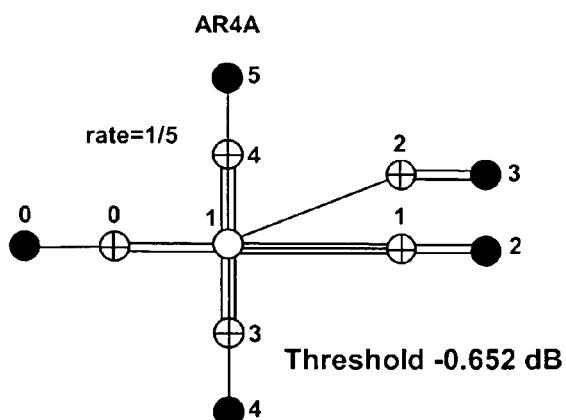
Figure 27:
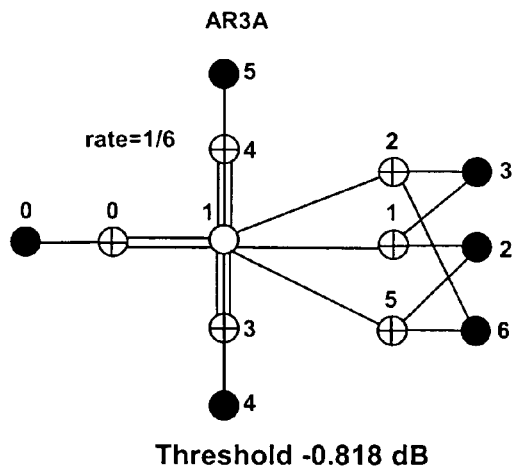
FIGS. 27 and 28 show rate-⅙ AR3A and AR4A protographs.
Figure 28:
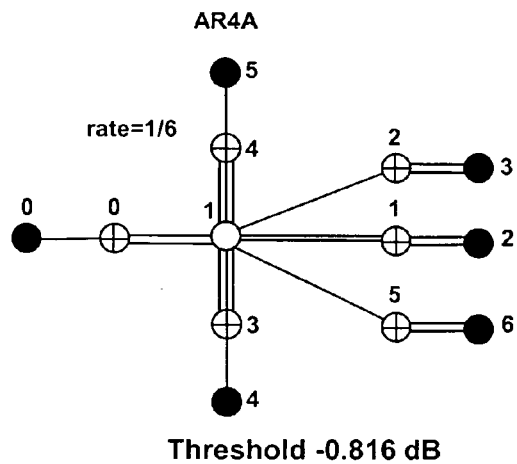
Figure 29:
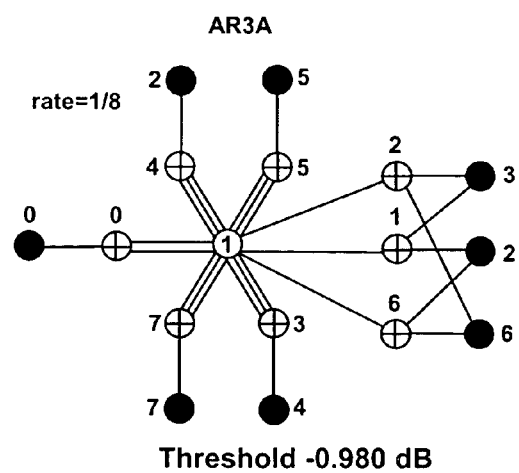
FIGS. 29 and 30 show rate-⅛ AR3A and AR4A protographs.
Figure 30:
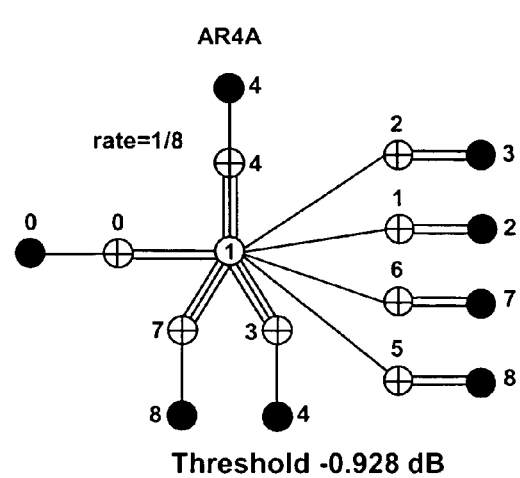

FIG. 18 shows a variation of the ARJA code family where all 'extension' (nodes use to extend the code to higher rate) input variable nodes have degree 4 (repetition 4).

In the following paragraphs, low-rate ARA type LDPC codes will be described.

For a given number of nodes and checks in a protograph one can search over all possible connections between variable and check nodes to obtain a protograph with the lowest threshold. For a rate-⅓ LDPC with 4 variable nodes and 3 checks where one variable node is punctured, there is a protograph with threshold of $Eb/N0=-0.326$ dB. The same protograph can be represented in at least two different ways, as shown in FIGS. 19 and 20. Each of these representations leads to a different SCC equivalent encoder.

The first encoder is similar to an ARA encoder except for an additional single-parity-check code. The second encoder is a simple serial concatenation (see S. Benedetto, D.

Divsalar, G. Montorsi, and F. Pollara, "Serial concatenation of interleaved codes: Performance analysis, design, and iterative decoding," IEEE Trans. Info. Theory, vol. 44, pp. 909-926, May 1998, incorporated herein by reference in its entirety, for a definition of serial concatenation) of a rate-½ two-state convolutional code as an outer code and a punctured accumulator as inner code, where the parity output of the outer code is also connected through a permutation to a single-parity-check code as a precoder.

Rather than searching, the applicants propose the following constructions extending the ARA families to low rates. In the ARA-3 or ARA-4 protographs shown in FIGS. 11 and 13, only the punctured variable node is kept in the middle column of variable nodes, and the transmitted variable(s) in this column are deleted along with their associated edges. This produces rate-⅓ ARA protographs having 4 variables and 3 checks with one variable punctured. The two checks on the right are still connected to two variables forming an accumulator. The single check and single degree-1 variable on the left can then be replaced by a constellation of such check-variable pairs to achieve lower rates.

FIGS. 19 through 33 show the constructed protographs in the ARA-3 and ARA-4 families, and their corresponding thresholds for rates ⅓ through ¹⁄₁₀. For the low-rate AR4A family, the applicants have also replaced the single accumulator in FIG. 11 with multiple parallel accumulators.

For rates ⅙ through ¹⁄₁₀, it becomes profitable to connect the degree-4 punctured variable node in the ARA-4 protograph to more than two check nodes and parallel accumulators. A three-accumulator configuration achieves the best threshold for rate ⅙, and a four-accumulator configuration is best for rates ⅛ and ¹⁄₁₀.

The constructions in FIGS. 19 through 30 can be regarded as hybrid concatenated codes (see D. Divsalar, S. Dolinar, J. Thorpe, C. Jones, "Low-rate LDPC Codes with Simple Protograph Structure," Submission-ISIT 2005, incorporated herein by reference in its entirety) where the outer code is a repetition code, the inner code is an accumulator with possible puncturing, and the parallel code is a low-density generator matrix (LDGM) code. The simplest version of LDGM code is implemented by a differentiator and single-parity-check codes with 3 inputs and one parity bit. In the construction, the applicants used repetition-3 (ARA-3 family) for lowest threshold and repetition-4 (ARA-4 family) for lower error floor performance.

In addition to ARA repeat 3 and repeat 4 protographs, also the ARJA protograph shown in FIG. 15 can be used to construct lower rate codes.

Figure 33:
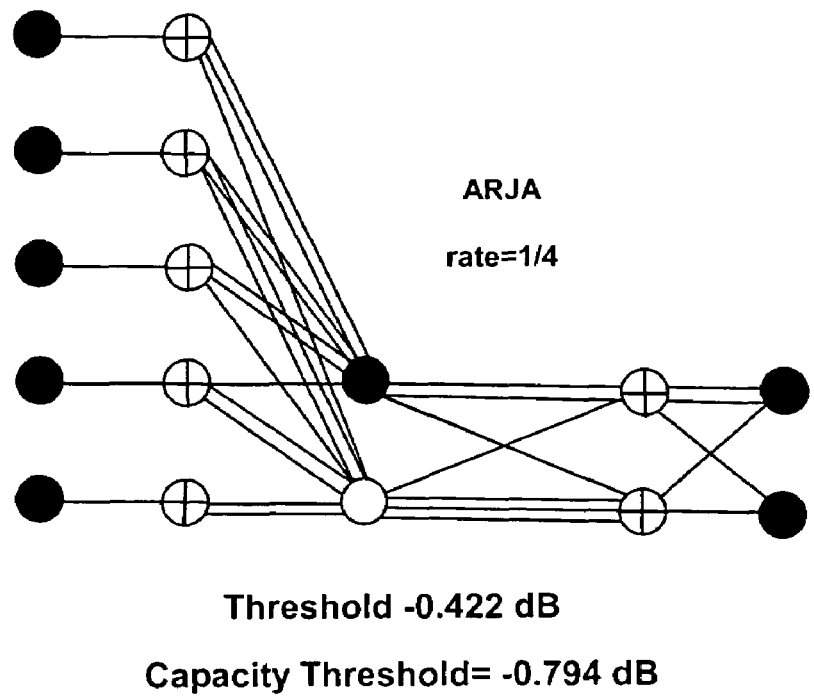
FIG. 33 shows a rate-¼ ARJA protograph.

The constructions in FIGS. 32 and 33 can be regarded as hybrid concatenated codes (D. Divsalar,and F. Pollara, "Hybrid concatenated codes and iterative decoding," Proceedings of 1997 IEEE International Symposium on Information Theory, page 10, Jun. 29-Jul. 4, 1997, incorporated herein by reference in its entirety) where the outer code is a repetition code, the inner code is a jagged accumulator with possible puncturing, and the parallel code is a low-density generator matrix (LDGM) code. The simplest version of an LDGM code is implemented via differentiator or a single-parity-check code with 3 inputs and one parity bit. In our construction we used the ARJA family due to its low threshold and error floor performance. This construction produces a rate-⅓ ARJA protograph having 7 variables and 5 checks with one variable punctured as shown in FIG. 32. The two checks on the right are still connected to two variables forming a jagged accumulator. The single check and single degree-1 variable on the left representing the precoder is also untouched. Thus the rate ½ ARJA base protograph is unchanged to preserve the code family structure. We used LDGM codes in parallel concatenation (similar to hybrid concatenation) to construct lower rate protographs.

FIGS. 32 and 33 show the constructed protographs in the ARJA family, and the corresponding thresholds and Shannon capacities for rates ⅓ and ¼.

Figure 34:
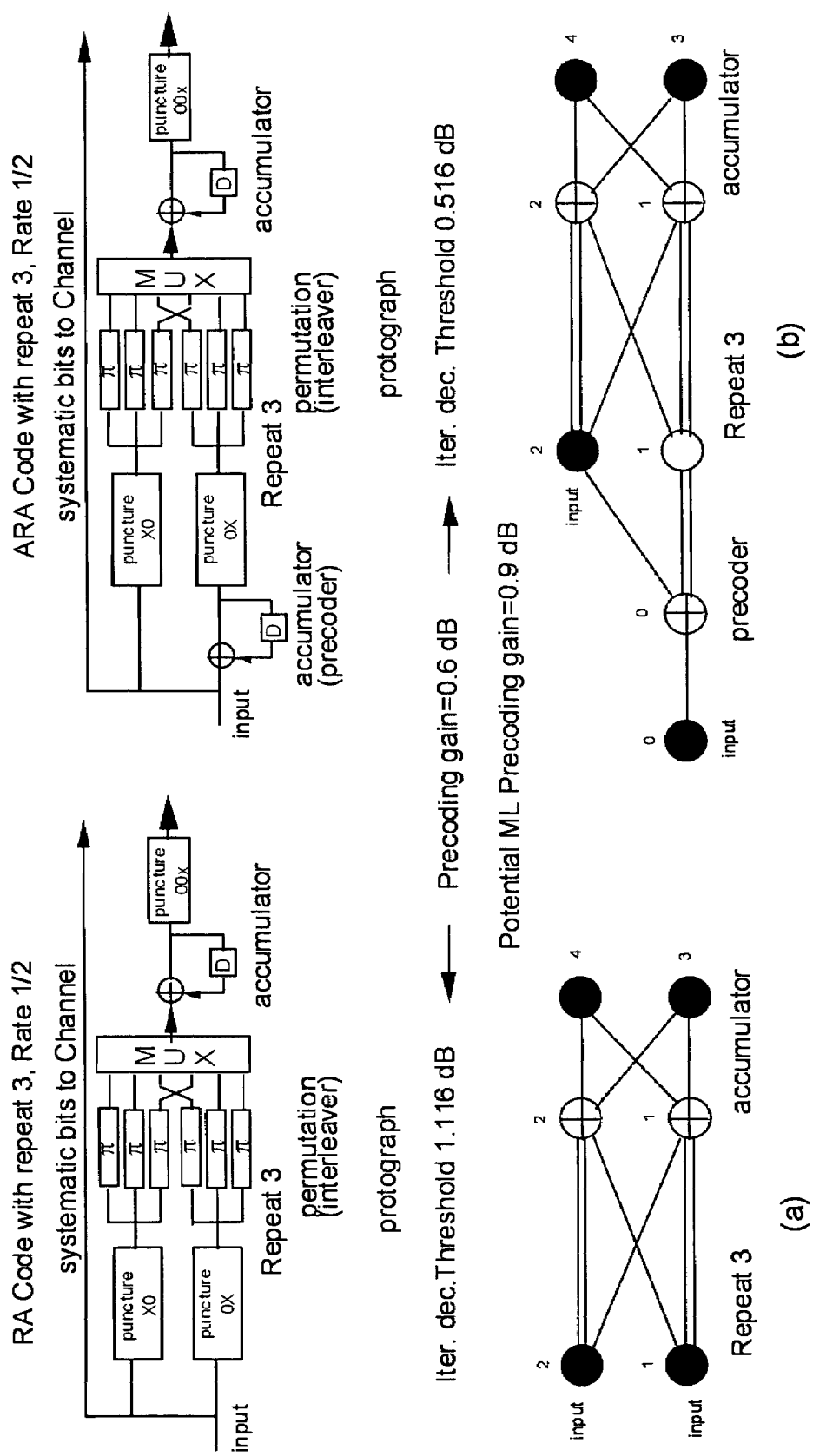
FIG. 34 shows interleaver decomposition for punctured RA and ARA codes and corresponding protographs.

FIG. 34 shows interleaver decomposition for punctured RA and ARA codes, where six interleavers with identical sizes are used according to the inner edge connections between variable nodes 1, 2 and inner check nodes 1, 2. The figure also shows the corresponding protographs.

FIG. 35 shows concatenation of an accumulator as inner code with an ARA with repetition 2 as an outer code. Codes in accordance with this coding scheme have been called Accumulate-Repeat-Accumulate-Accumulate by the Applicants. These codes are suitable for low error floor applications. The minimum distance is larger than ARA codes. The figure also shows the corresponding protograph.

Figure 36:
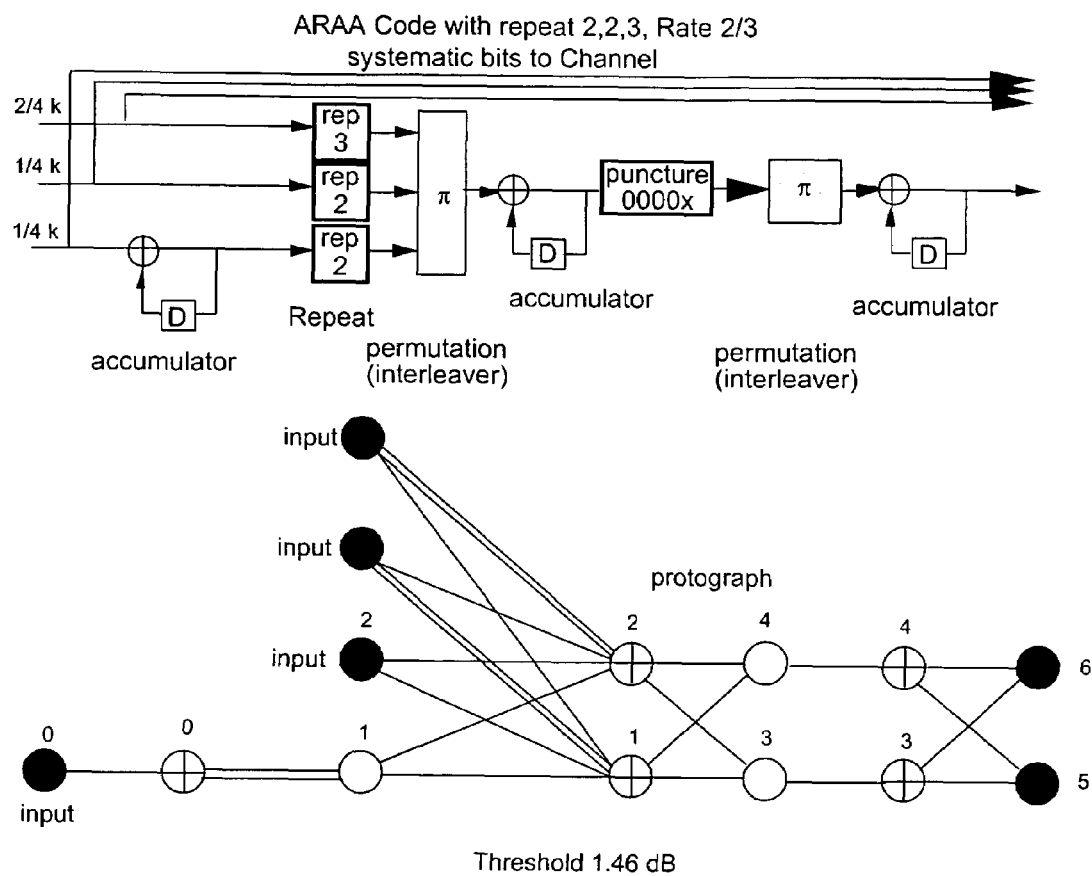
FIG. 36 shows a construction method for rate ⅔ ARAA codes and the corresponding protograph.

FIG. 36 shows a construction method for rate ⅔ ARAA codes and the corresponding protograph.

Figure 37:
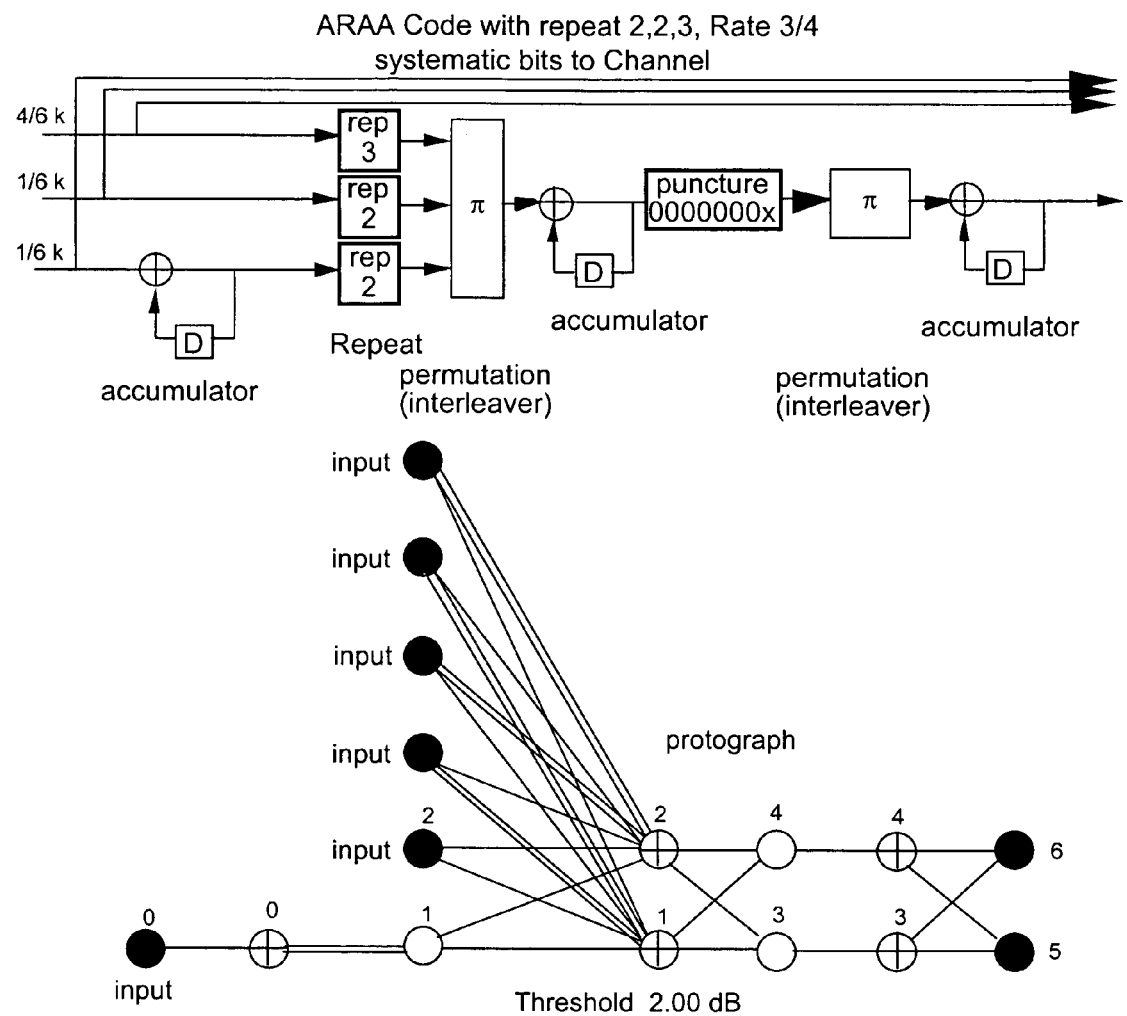
FIG. 37 shows a construction method for rate ¾ ARAA codes and the corresponding protograph.

FIG. 37 shows a construction method for rate ¾ ARAA codes and the corresponding protograph.

Figure 38:
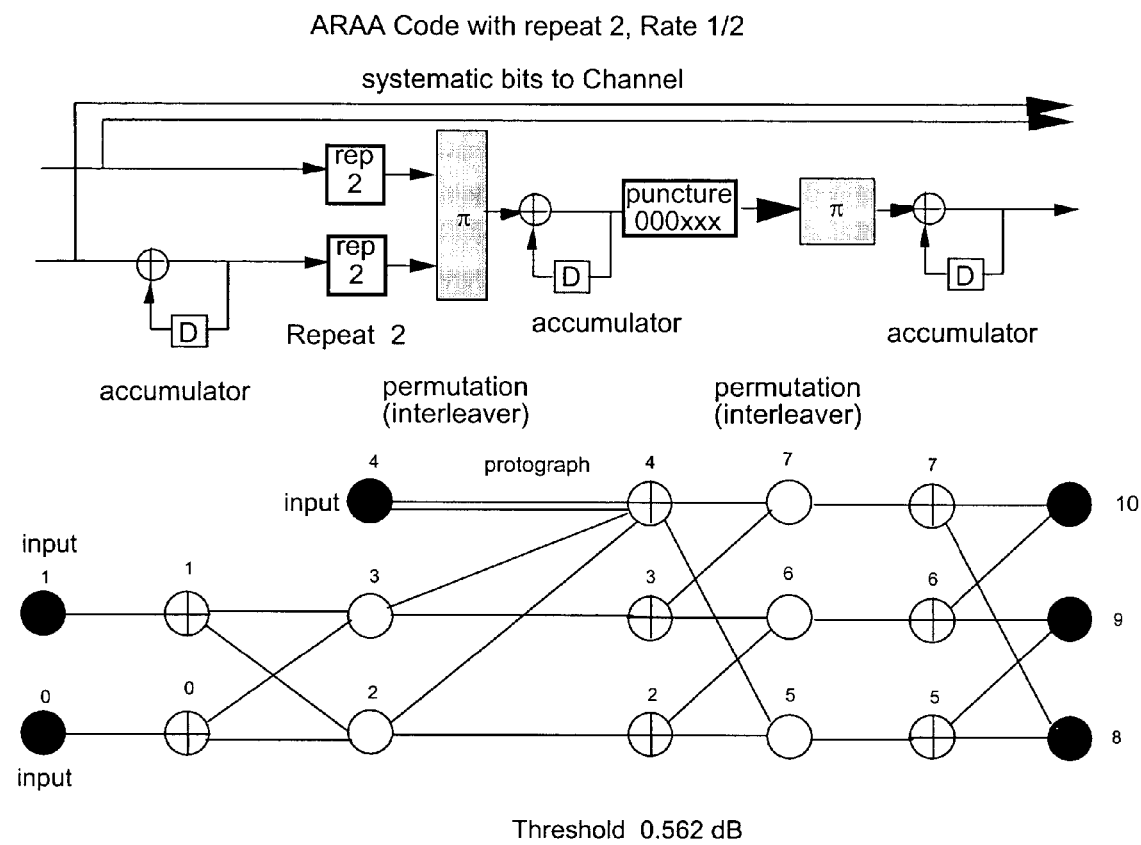
FIG. 38 shows an alternative construction method for rate ½ ARAA codes with more nodes and the corresponding protograph.

FIG. 38 shows an alternative construction method for rate ½ ARAA codes with more nodes and the corresponding protograph.

Figure 39:
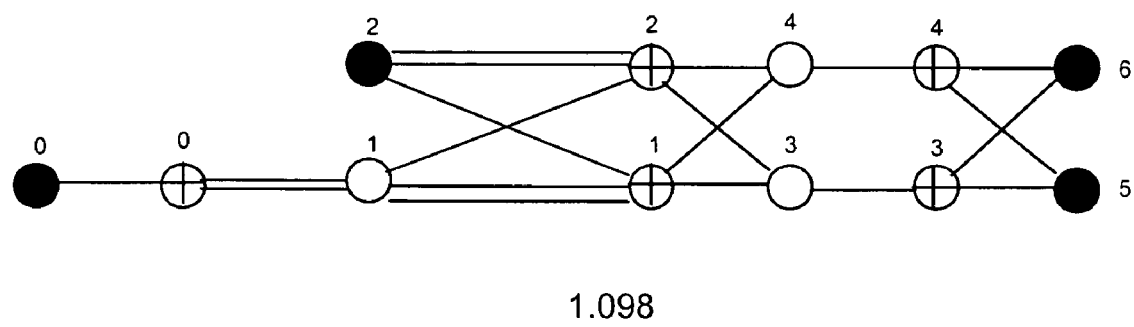
FIG. 39 shows rate ½ ARAA codes with repetition 3 and the corresponding protograph.

FIG. 39 shows rate ½ ARAA codes with repetition 3. The minimum distance of this code grows linearly with the block size and a fast encoder can be implemented. The figure also shows the corresponding protograph.

FIG. 40 shows rate ½ Accumulate Repeat Check Accumulate codes (ARCA) codes with repetition 3. These codes are similar to ARA codes but half of the permuted bits after repetition are past through to single parity check codes, multiplexed and then applied to a punctured accumulator. Also the output of the second single parity check code is transmitted through the channel. The figure also shows the corresponding protograph.

Figure 41:
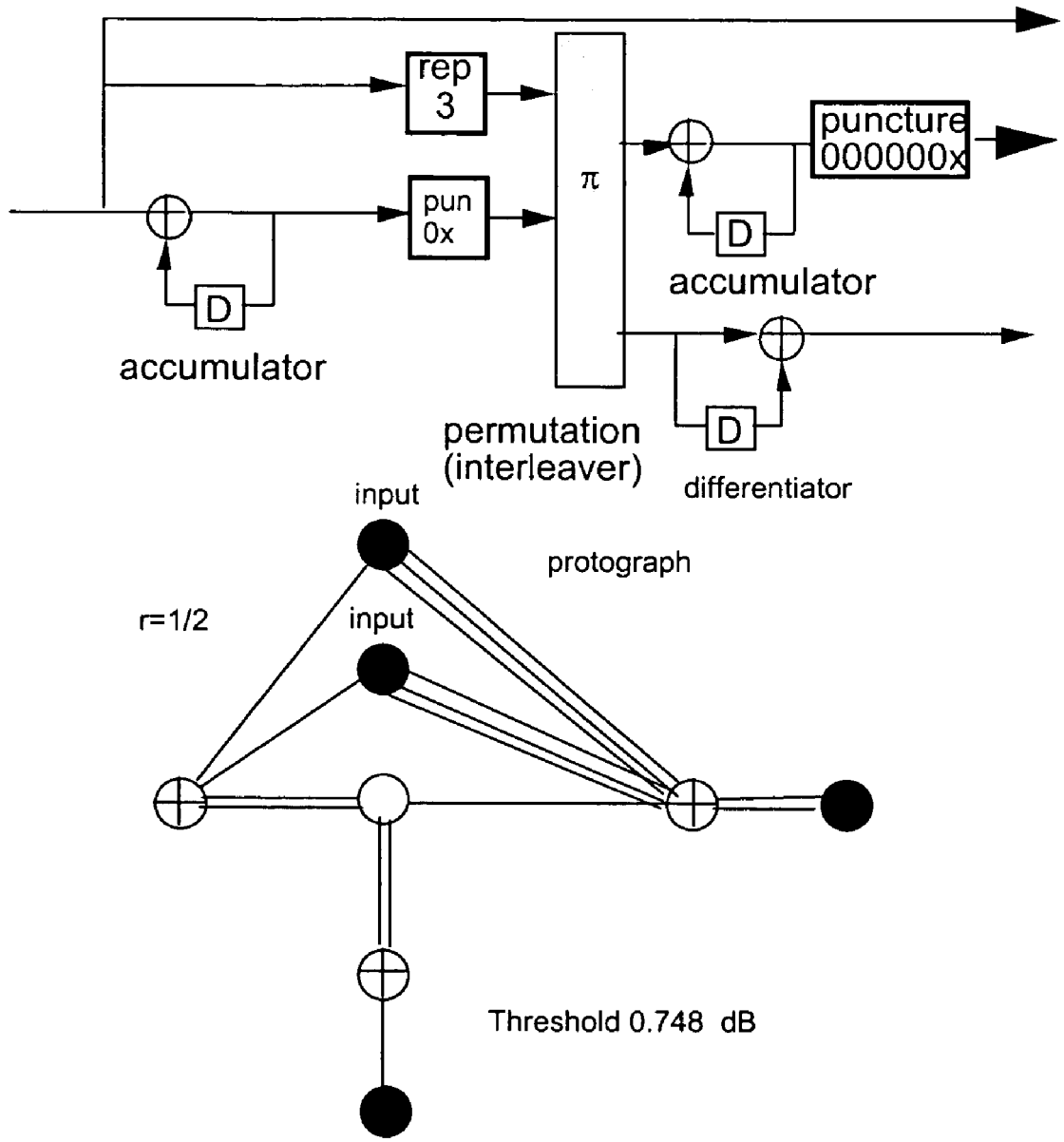
FIG. 41 shows rate ½ precoded serial codes with repetition 3 and the corresponding protograph.

FIG. 41 shows rate ½ precoded serial codes with repetition 3 and the corresponding protograph. An encoder can be implemented using a punctured accumulator as an outer code, a differentiator as precoder, and another punctured accumulator as inner code. In FIG. 41 repetition 3 has been used for the input bits. However, no repetition or any other repetition can also be used depending on the trade off between threshold and error floor.

Figure 42:
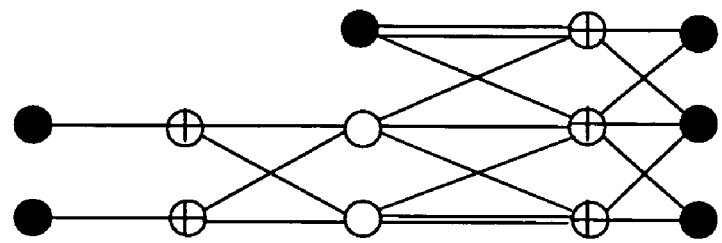
FIG. 42 shows a rate ½ ARJA type protograph code, where the number of degree 2 nodes now is ⅔ the number of the inner check nodes.

FIG. 42 shows a rate ½ ARJA type protograph code, where the number of degree 2 nodes now is ⅔ the number of the inner check nodes. It was believed that if $\lambda'(0) \rho'(1) < 1$ ($\lambda(x)$ being the degree distribution of variable nodes, $\rho(x)$ the degree distribution of check nodes, and prime representing a derivative with respect to x), then the asymptotic minimum distance of LDPC codes grows with the block length of the code. The Applicants have proven that this is not true for protograph based LDPC codes. The example of FIG. 42 shows that the asymptotic minimum distance of the protograph code in FIG. 42 grows with the block length of the code where the condition proposed by the experts is violated.

Figure 43:
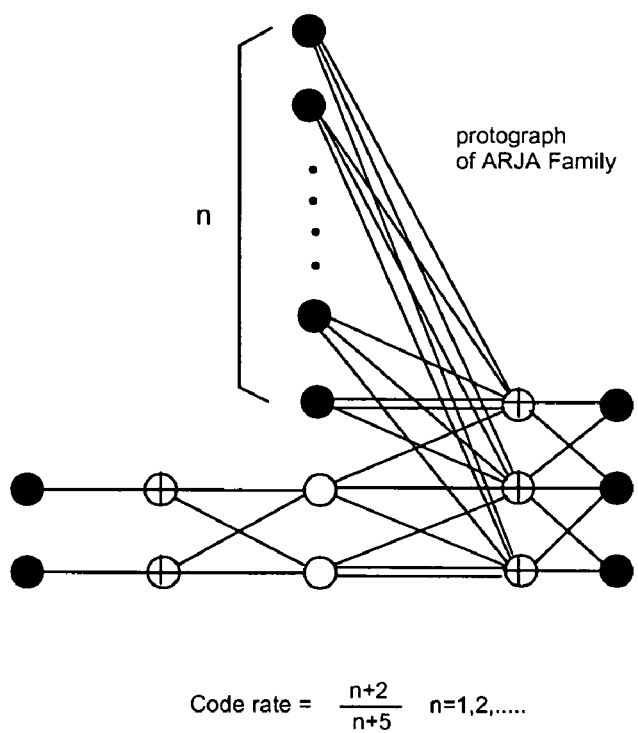
FIG. 43 shows a construction method for higher code rates for the example in FIG. 42 and a table of thresholds for various code rates.

FIG. 43 shows a construction method for higher code rates for the example in FIG. 42 and a table of thresholds for various code rates.

Figure 44:
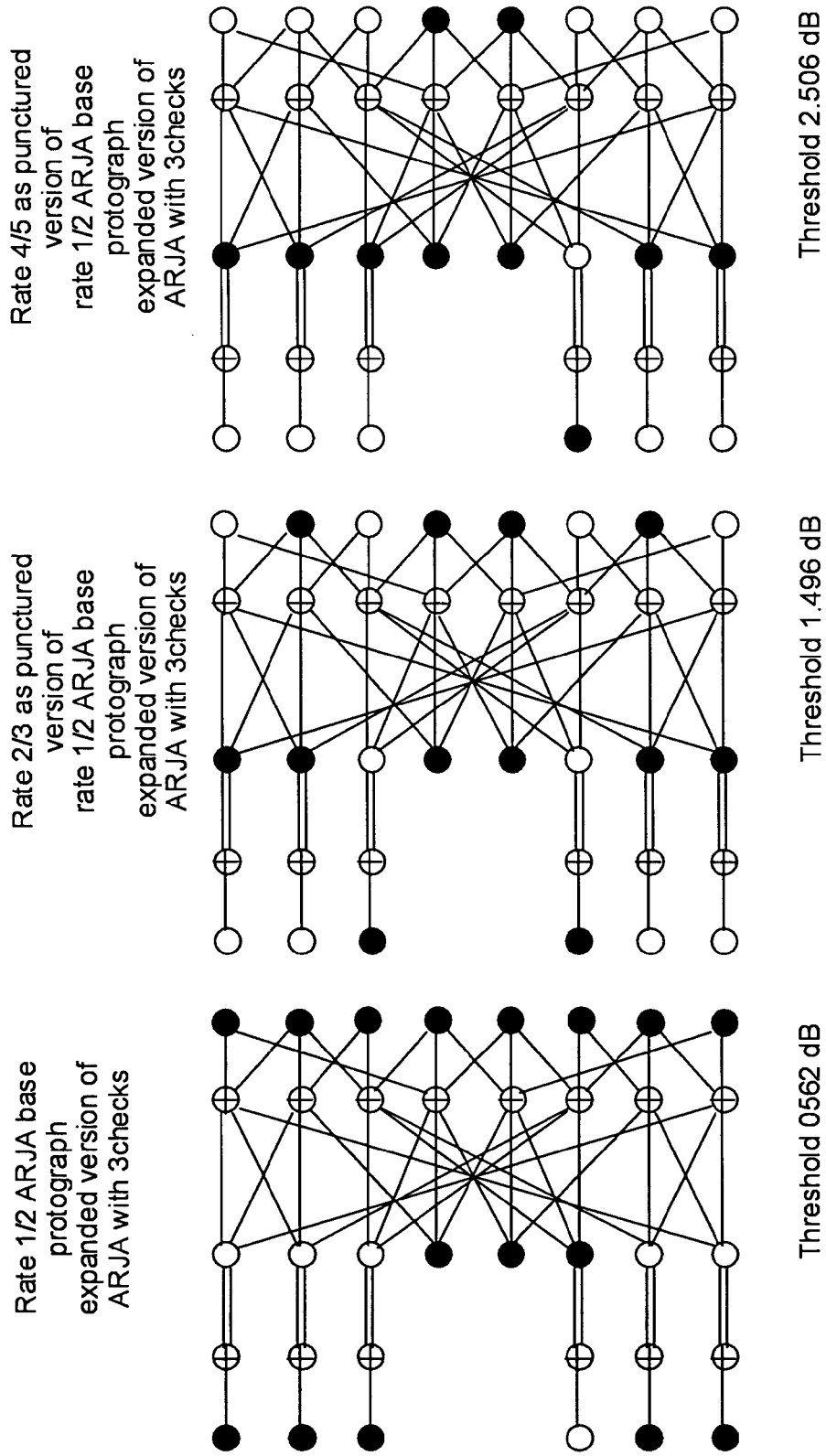
FIG. 44 shows a construction method for rates ⅔ and ⅘ of a rate ½ ARJA type base protograph code with repletion 3 where the number of degree 2 nodes is ½ the number of the inner check nodes.
Figure 45:
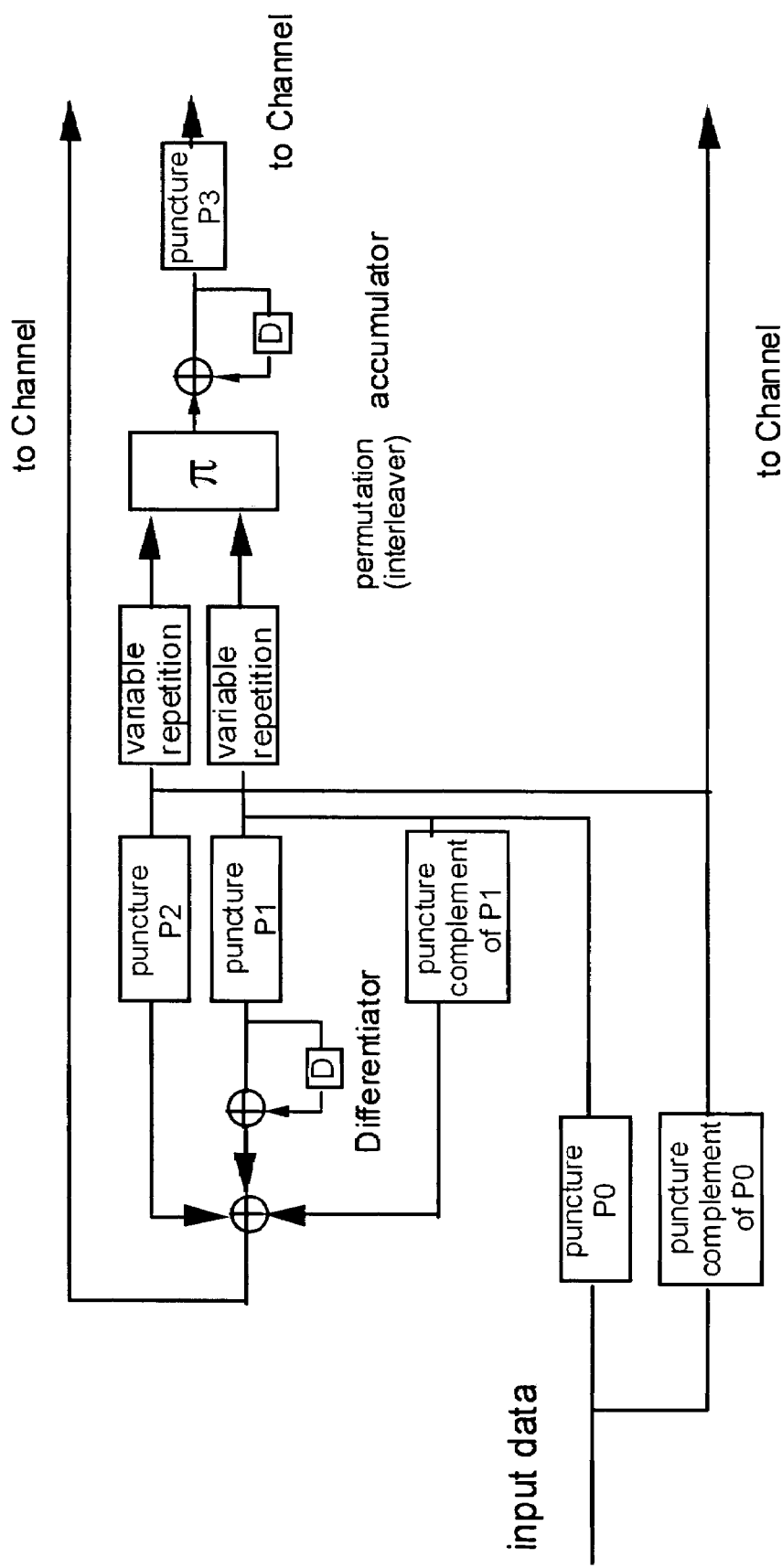
FIGS. 45, 46, 47, and 48 show encoders for a structure of ARA codes using a differentiator instead of an accumulator as a precoder.
Figure 46:
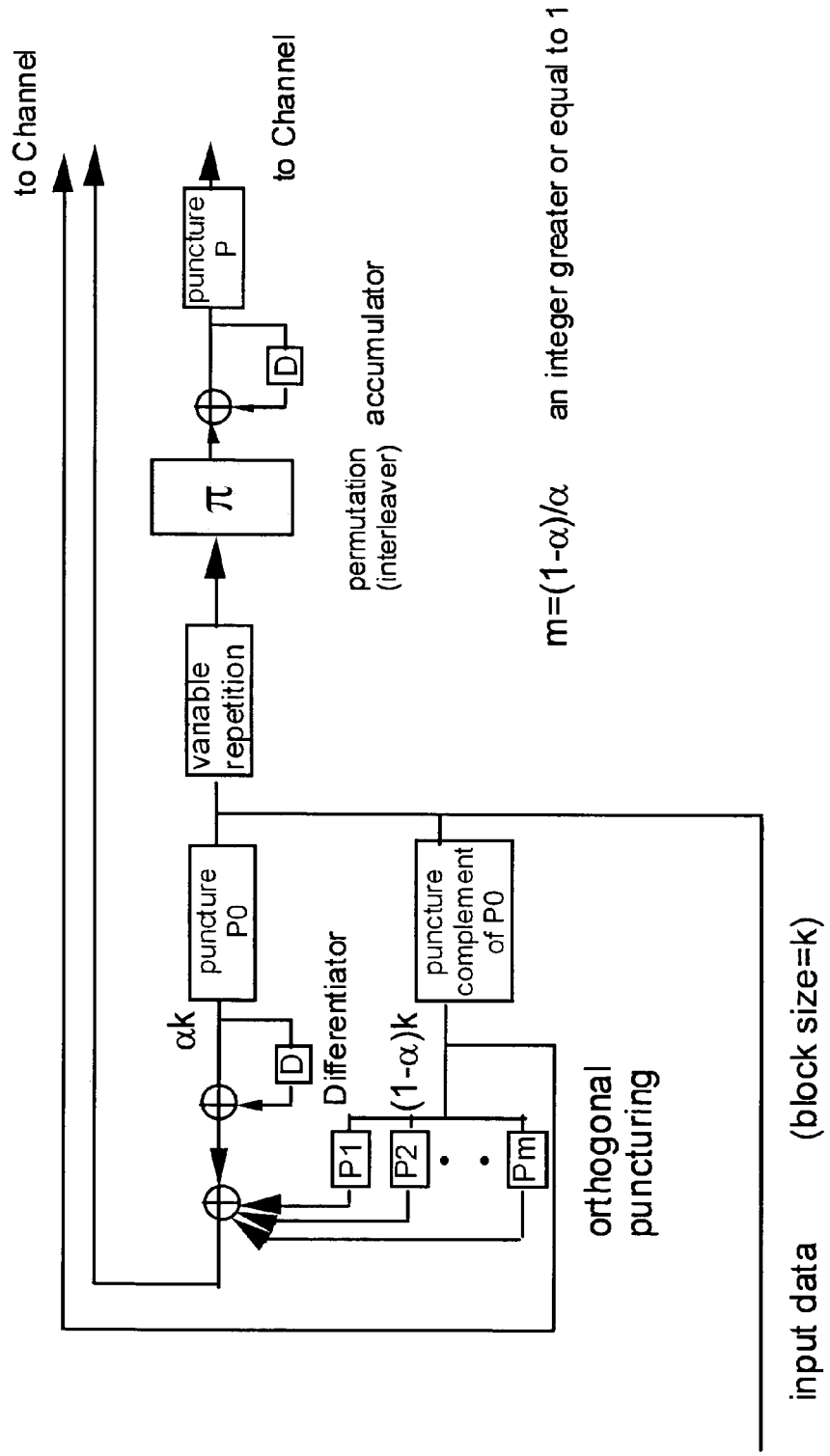
Figure 47:
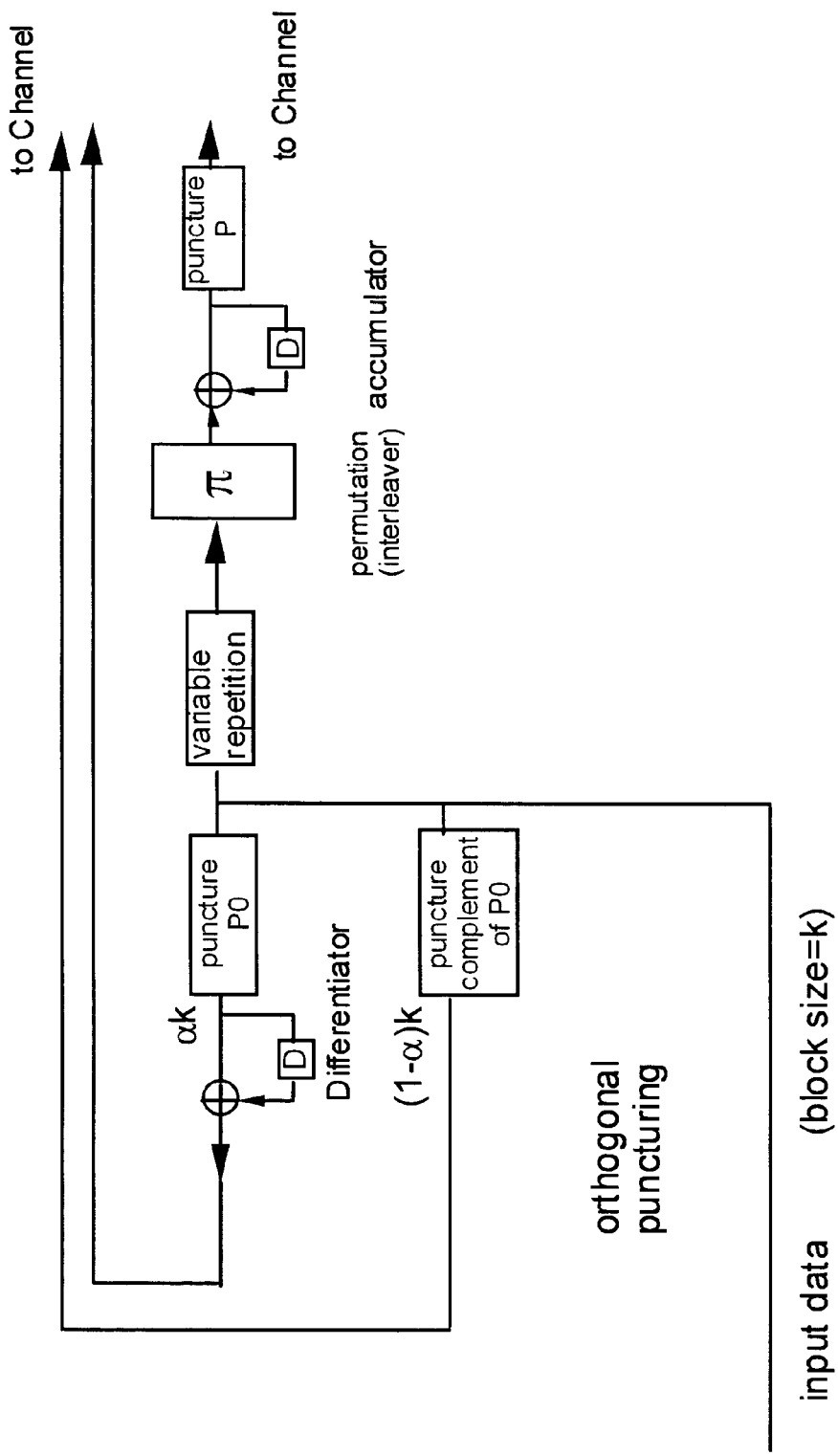

FIG. 44 shows a construction method for rates ⅔ and ⅘ of a rate ½ ARJA type base protograph code with repetition 3 where the number of degree 2 nodes is ½ the number of the inner check nodes. The rate ½ ARJA base code is first expanded by a factor 4. With proper puncturing of variable nodes as shown in FIG. 44, rate ⅔ and ⅘ are constructed. Thus, the embodiment of FIG. 44 shows that, starting with a base protograph, higher code rates can be constructed by proper puncturing.

Figure 48:
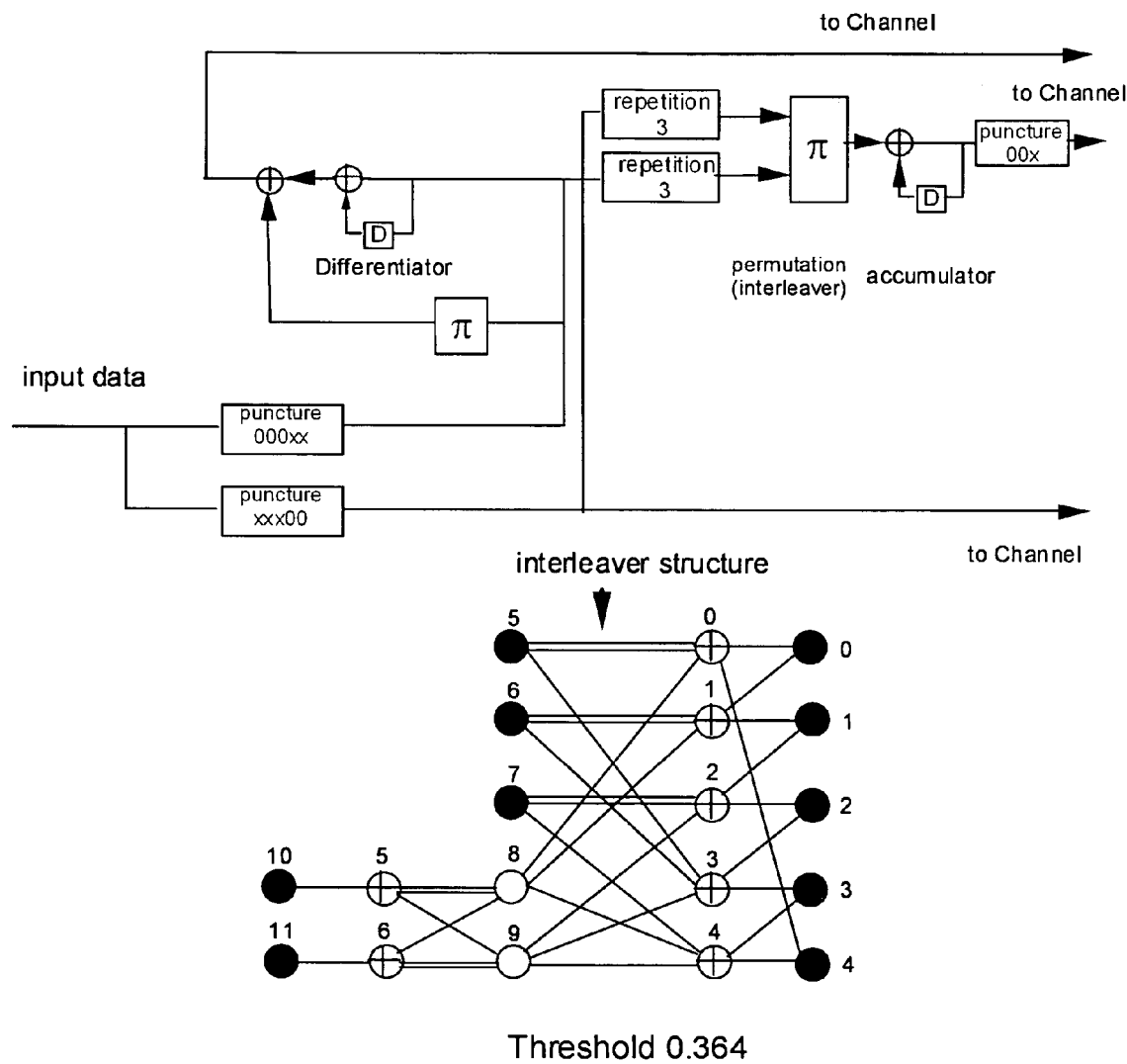

FIGS. 45, 46, 47, and 48 show encoders for a structure of ARA codes using a differentiator instead of an accumulator as a precoder. In FIG. 48 also the corresponding protograph is shown, where a more general LDGM code is used as precoder.

Figure 49:
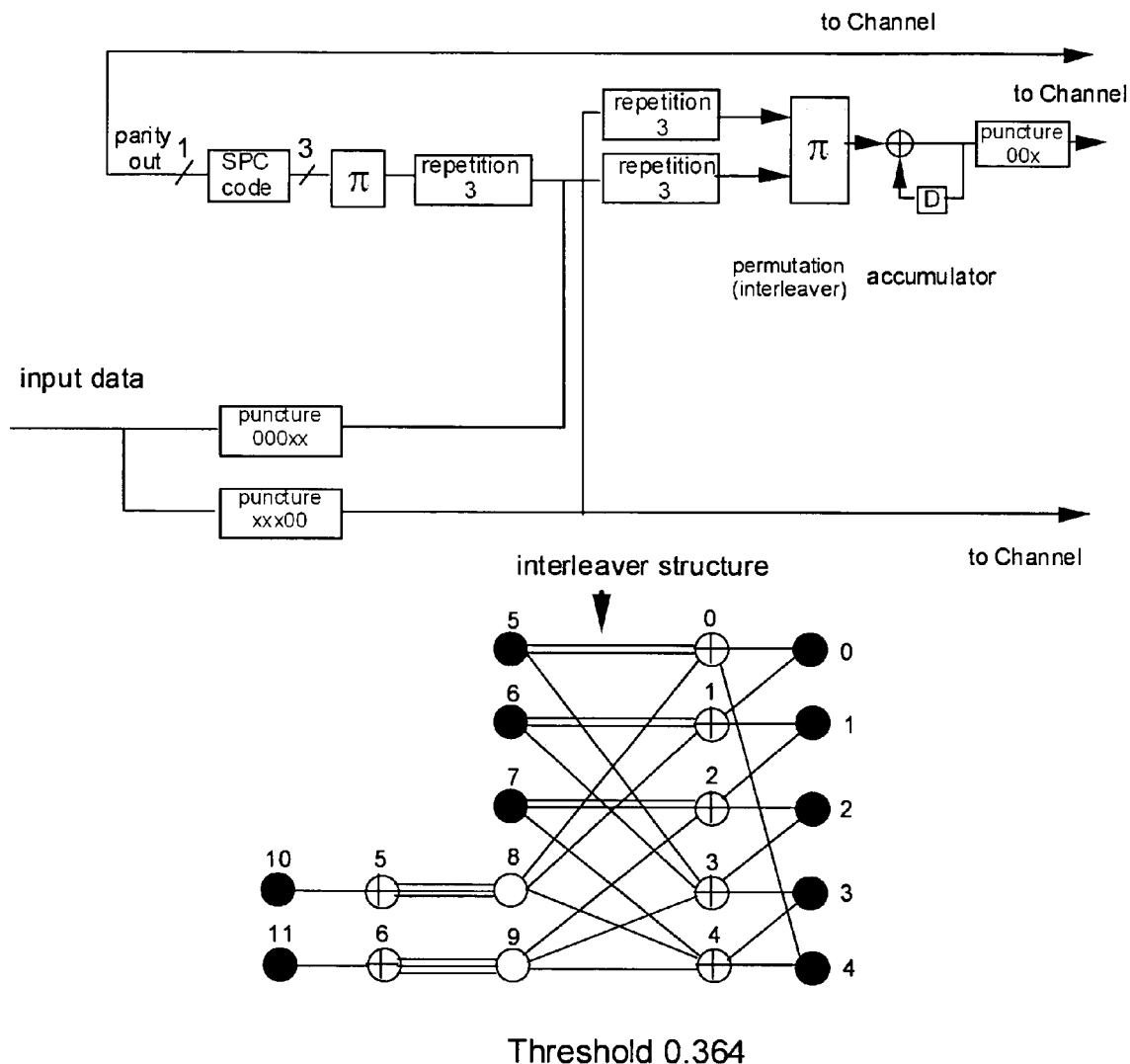
FIG. 49 shows an encoder for an ARA type protograph code where repetition 3 with an interleaver and a single parity check (SPC) code are used instead of accumulator as the precoder.

FIGS. 49 shows an encoder for an ARA type protograph code where repetition 3 with an interleaver and a single parity check (SPC) code are used instead of accumulator as the precoder. FIG. 49 also shows the corresponding protograph where a more general LDGM code (repeat 3, interleaver, and single parity check code) is used as the precoder.

Figure 50:
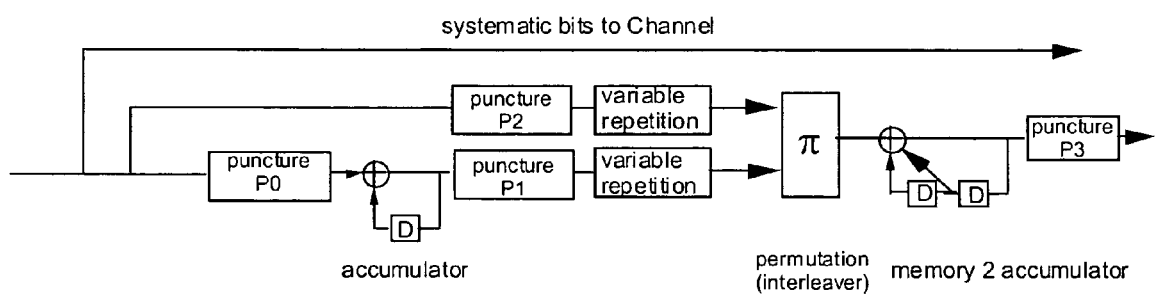
FIGS. 50, 51 and 52 show the encoders for a structure of ARA type codes using 4-state rate-1 recursive convolutional codes.
Figure 51:
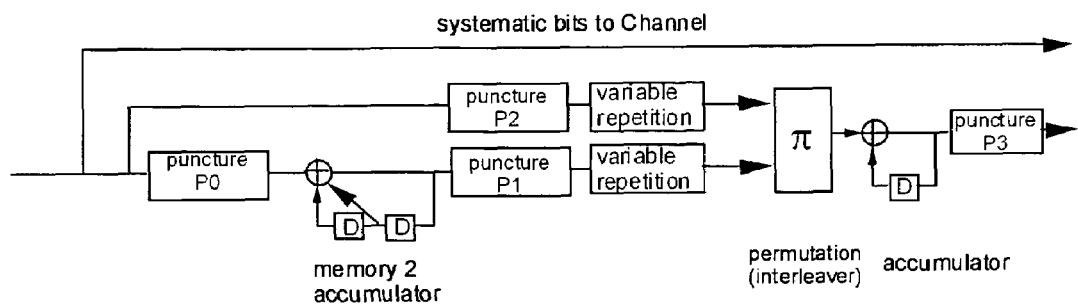
Figure 52:
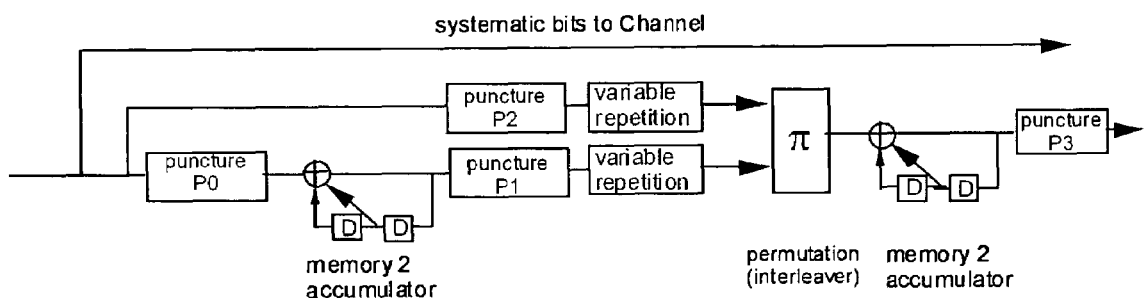

FIGS. 50, 51 and 52 show the encoders for a structure of ARA type codes using 4-state rate-1 recursive convolutional codes. In FIG. 50, the inner accumulator in the ARA type code was replaced by a memory 2 accumulator (which can also be considered as a rate-1, 4-state convolutional code). The outer and/or inner accumulators can be extended to more complex rate 1 recursive convolutional codes such as $1/(1+D+D^2)$. In such case soft input soft output (SISO) will be used instead of the message passing (belief propagation) algorithm. In FIG. 51, a memory 2 accumulator represent the precoder. In FIG. 52, both the inner accumulator and the precoder in the ARA type code use memory 2 accumulators as the inner accumulator and the precoder.

Figure 53:
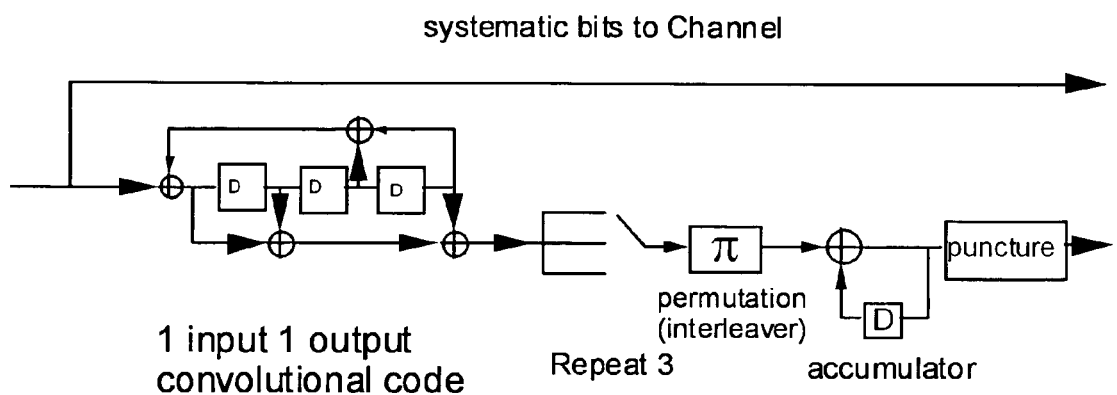
FIG. 53 shows an encoder for more complex type ARA codes using a 8-state rate-1 recursive convolutional code as the precoder. In this example, repetition 3 and punctured inner accumulator are used.

FIG. 53 shows an encoder for more complex type ARA codes using a 8-state rate-1 recursive convolutional code as the precoder. In this example, repetition 3 and punctured inner accumulator are used.

Figure 54:
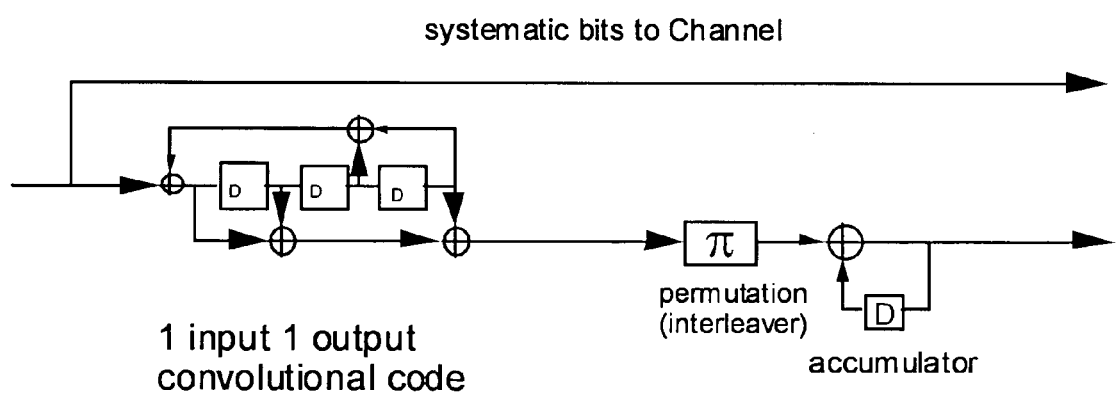
FIG. 54 shows an encoder similar to the one used in FIG. 53, where no repetition is used and the accumulator is not punctured.

FIG. 54 shows an encoder similar to the one used in FIG. 53, for rate ½ ARA codes, where no repetition is used and the accumulator is not punctured.

Figure 55:
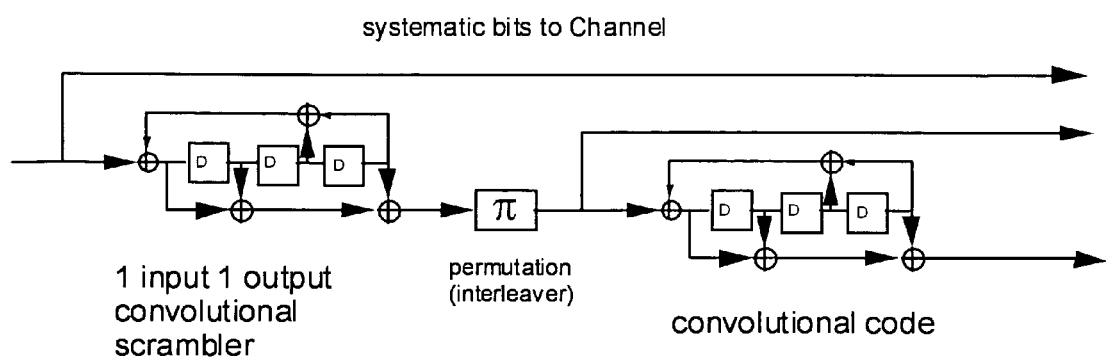
FIG. 55 shows ARA codes of a more complex type, where both the inner code and the precoder are replaced with rate-1 recursive convolutional codes.

FIG. 55 shows ARA codes of a more complex type (rate ⅓), where both the inner code and the precoder are replaced with rate-1 recursive convolutional codes.

Figure 56:
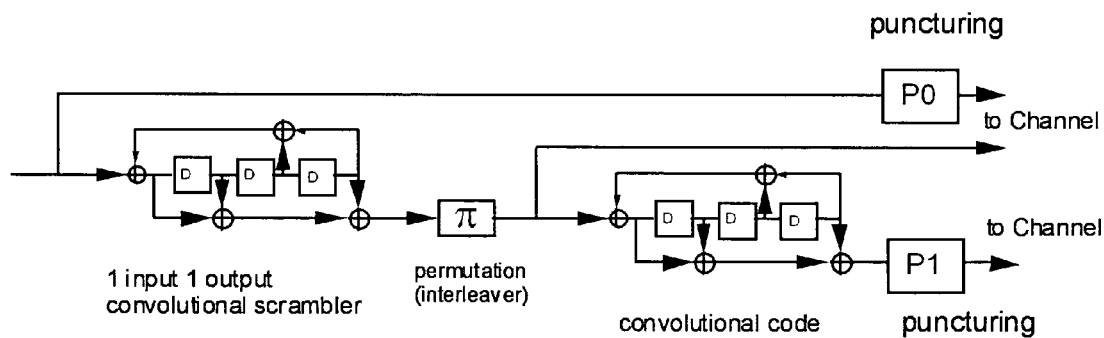
FIG. 56 shows an encoder similar to the one used in FIG. 55, where puncturing devices P0 and P1 are used to generate higher code rates.

FIG. 56 shows an encoder similar to the one used in FIG. 55, where puncturing devices P0 and P1 are used to generate higher code rates. The structure of FIG. 56 does not represent serial concatenation, since, without termination, its code rate is 1. Therefore, the interleaver size is equal to the input block size. Further, it is not a parallel concatenation of two convolutional codes. The performance of this system is as good as turbo codes. The feedforward polynomial of the 1 input 1 output scrambler (precoder or rate-1 outer code) is preferably primitive as is the feedback polynomial of the inner convolutional code. The embodiment shown in FIG. 56 is just an example. The number of states and feedforward/feedback polynomials can be different from what shown.

Software and hardware implementations of the contents of the present disclosure will be clear to the person skilled in the art upon reading of the present disclosure. Examples of software and hardware implementations can be found in U.S. patent application Ser. No. 11/166,041 for "Encoders for Block-Circulant LDPC Codes," filed on the same day of the present application and incorporated herein by reference in its entirety.

The codes embodied in the present disclosure have been designed for use in transmission channels, for example power constrained channels. The channels that exist between the Earth and man-made probes traveling many millions of kilometers away from the Earth are often power constrained. Geo-synchronous satellite channels are also often power constrained. The codes of the present disclosure allow communication not only at relatively low received Signal to Noise Ratio levels (as is the case for the lowest rate codes in the present disclosure) but also provide very high power efficiency at all rates. As such, these codes are also well suited to bandwidth constrained channels where a user wishes to maximize throughput for a given transmit power level.

Examples of bandwidth constrained channels include fixed wireless terrestrial channels, mobile wireless terrestrial channels, and terrestrial wired channels which occur in cable modem and digital subscriber line systems. These codes may also appropriate for use in mass storage applications such has hard disk drive systems. In addition, it has been shown (W. Zhong and J. García-Frías: "Compression of Non-Binary Sources Using LDPC Codes", Proc. CISS'05, March 2005, Baltimore, Md.) that LDPC codes can be used in data compression applications. The codes described in the present disclosure are appropriate to such application.

Implementations of the codes described in the present disclosure have been constructed in Xilinx Virtex-II field programmable gate arrays (FPGA). In particular, all of the codes embodied in the present disclosure have been tested using a prototyping system that interfaces with a personal computer and supports a graphical user interface based on software developed in a programming language appropriate to the platform. The prototype permits encoding, the addition of corruptive noise, and decoding with a throughput in excess of 10 Mega bits per second. Other physical implementations of encoding and decoding sub-systems based on the codes of the present disclosure that achieve higher throughput, low-power, or lower overall complexity may be possible.

While several illustrative embodiments of the invention have been shown and described in the above description and in the enclosed Annex A, numerous variations and alternative embodiments will occur to those skilled in the art. Such variations and alternative embodiments are contemplated, and can be made without departing from the scope of the invention as defined in the appended claims.

ANNEX A

I. Protograph-Serial Code Equivalence Constructions

Throughout the description of the present application it has often been simpler to describe a protograph representation of a given code than to provide a serial-concantenated-code (SCC) version of the description. SCC descriptions have the advantage of providing clear encoder block diagrams for the codes of the present disclosure. A protograph description of code, on the other hand, provides a clear view of the underlying structure of the bi-partite graph on which *decoding* is performed. However, a protograph description is also adequate for defining an encoder structure for the code . See the application entitled "Encoders for Block-Circulant LDPC Codes" incorporated herein by reference.

Therefore, protograph descriptions of the codes in the present application have the advantage of simplicity while simultaneously providing encoding and decoding descriptions. For these reasons, the protograph description of the codes in the present disclosure can be thought of as canonical. In the remainder of this Annex transformation techniques for mapping SCC block diagrams to protographs and vice-versa will be outlined.

The modules in Fig. A show single and $l$-bit accumulator structures. The left hand side of the figure shows the SCC sub-module while the right shows the protograph equivalent. The primary difference between the two representations is that the protograph equivalent has no notion of a time sequence in the information flow meaning all data is represented 'simultaneously'. This can be seen explicitly as the `delay' elements (in the small boxes on the left hand side), which represent a unit time of data, do not appear in the right hand side drawings. Note also that boxes with `Pi' symbols in the lower left and right hand side drawing denote `bit-interleaving' operations. This operator randomly permutes bits between its input and output. In the case of the lower left-hand-side drawing, the permutation occurs in time and incorporates a parallel input with a serial output. On the right-hand-side the bit-interleaving step acts as a random switching box that maps each unique input lane to a unique output lane.

Transformation Modules
For Expressing Serially Concatenated Codes as Protographs 1-bit

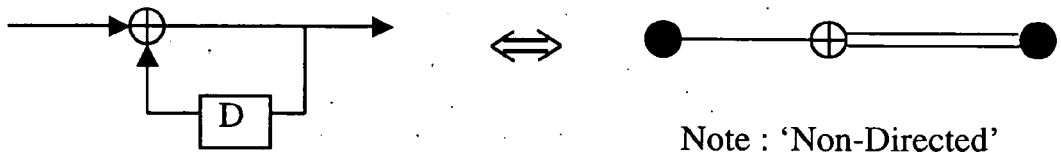

Note : 'Non-Directed'

$l$-bit with permutation (4-bit here)

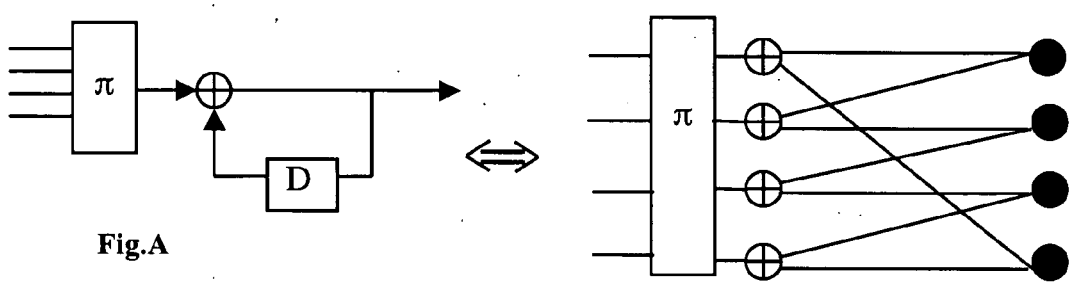

Fig.A

Puncturing the output of an accumulator allows a desired code-rate to be maintained. In the SCC block diagrams the symbol 'x' refers to a bit that is passed unaltered through the corresponding puncture box, and the symbol '0' refers to a bit that is punctured (not output) by the puncture box. In the intermediate "protograph transform" diagrams of Figs. B through E, variable nodes corresponding to the various puncture box outputs are labeled with 'x' or '0', accordingly. The single puncture boxes of Figs. B, C, and E, send their outputs to the channel, so in these cases the patterns of 'x' and '0' labels exactly match the patterns of black and white circles indicating, respectively, variable nodes that are or are not transmitted. In Fig. D, the outputs of the two leftmost puncture boxes are not directly sent to the channel, and we observe both an unpunctured output 'x' that is not transmitted (white circle) and a punctured output '0' that is transmitted separately (black circle). Note that in the final reduced protograph '0' is the node number.

*l*-bit with permutation with output puncturing (0=puncture)

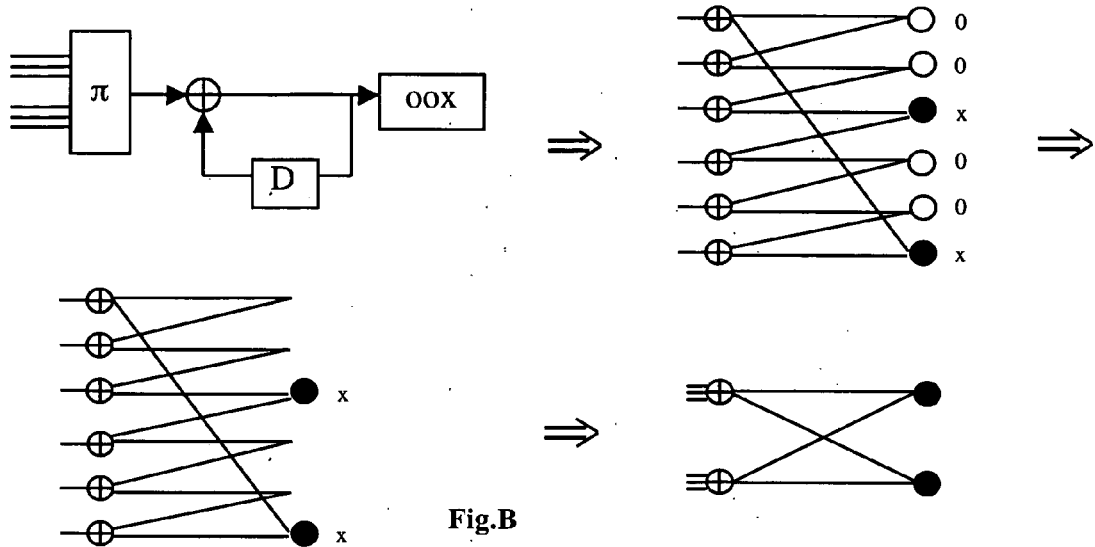

Fig.B

In Fig.B the output of a 6 bit accumulator is punctured such that every 3rd bit is included in a codeword. Puncturing output nodes allows check operations to be linearly combined without altering their outputs. The result is the upper left hand side of Fig.B is equivalent to the lower right hand side.

II. Protograph-Serial Equivalence Application

The equivalence structures of Figs.A and B are applied to derive the SCC <-> protograph equivalence of the Repeat-Accumulate (RA) code in Fig.C.

Systematizing and Puncturing Rate 1/3 RA to Realize Rate 1/2

Systematic punctured RA Code

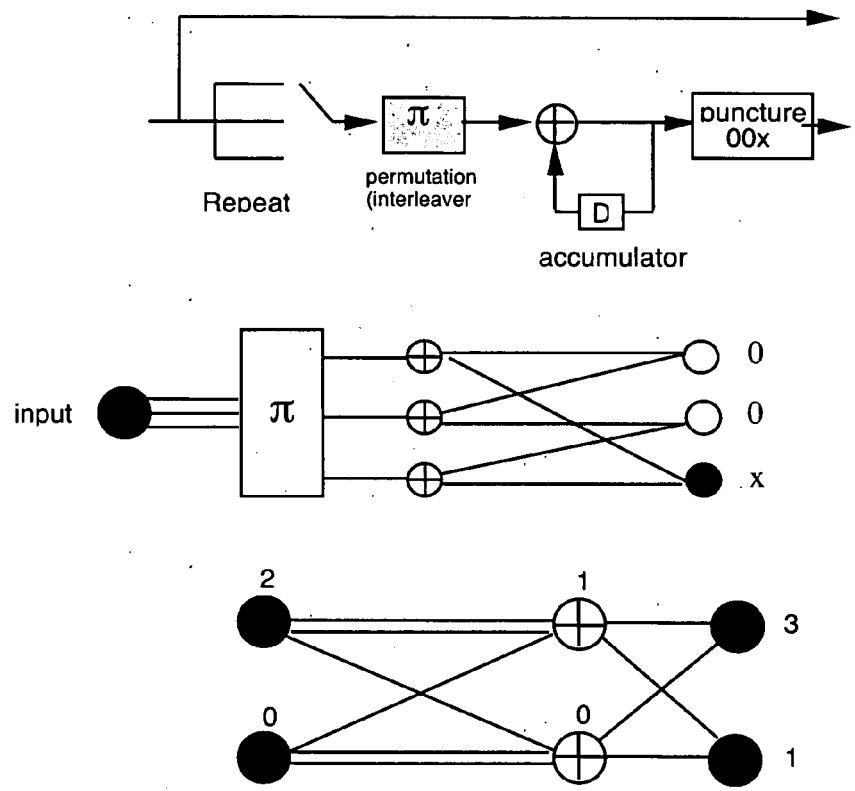

Fig.C

The RA code of Fig.C is known in the art. On the other hand, the SCC <-> protograph equivalents given in Figs.D (ARA-3) and E (ARA-4) make part of the applicant's contribution in accordance with the present disclosure. For the sake of conciseness, some of the claimed structures of the present application have been described only with protograph structures. This annex has shown that an equivalence between and SCC structure (which is defines and encoding method) and a protograph structure (which defines and encoding as well as a decoding) can be drawn. Fig.F provides additional auxiliary information regarding protograph transformations.

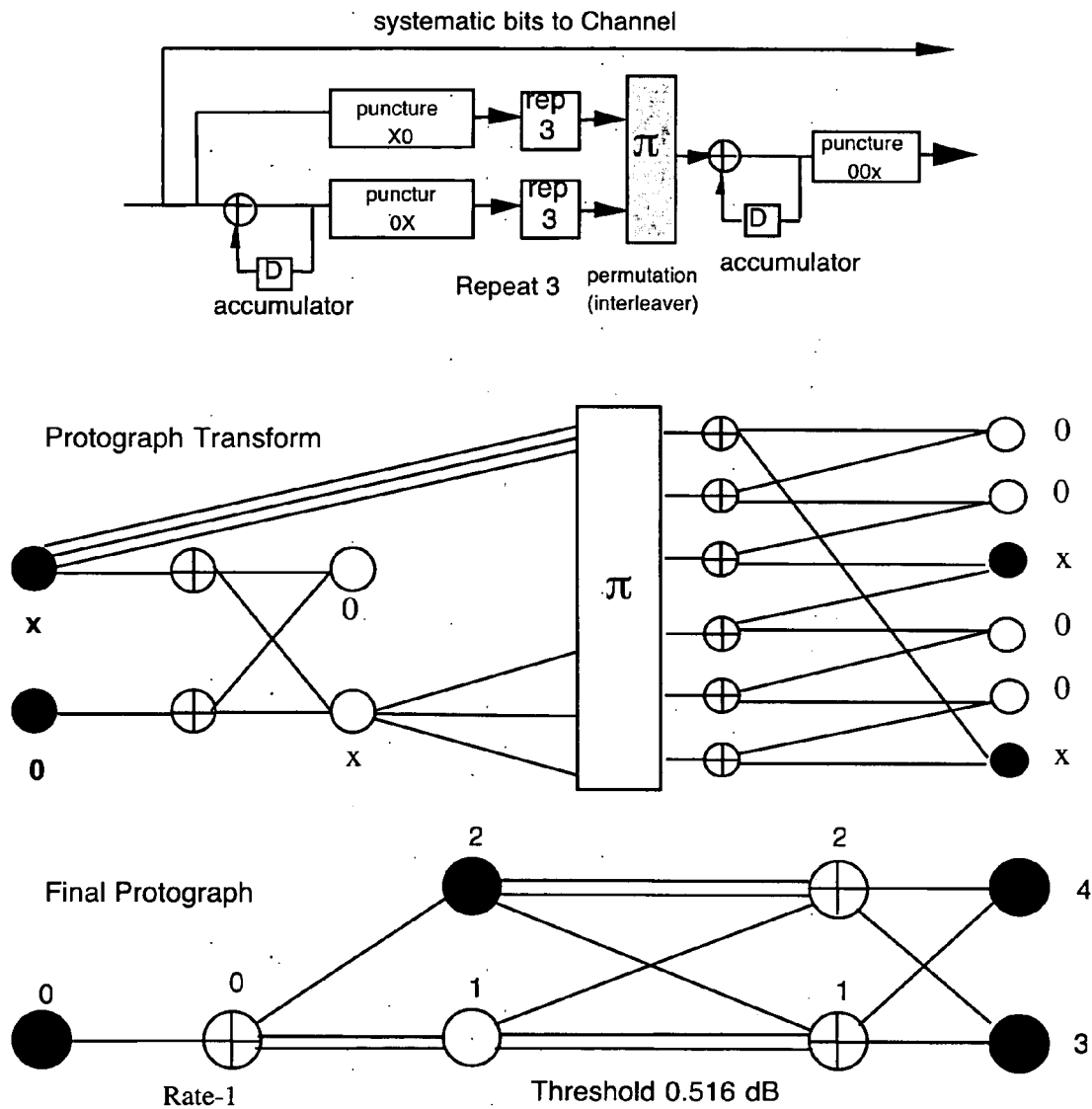
Fig.D ARA Repeat 3, Rate 1/2

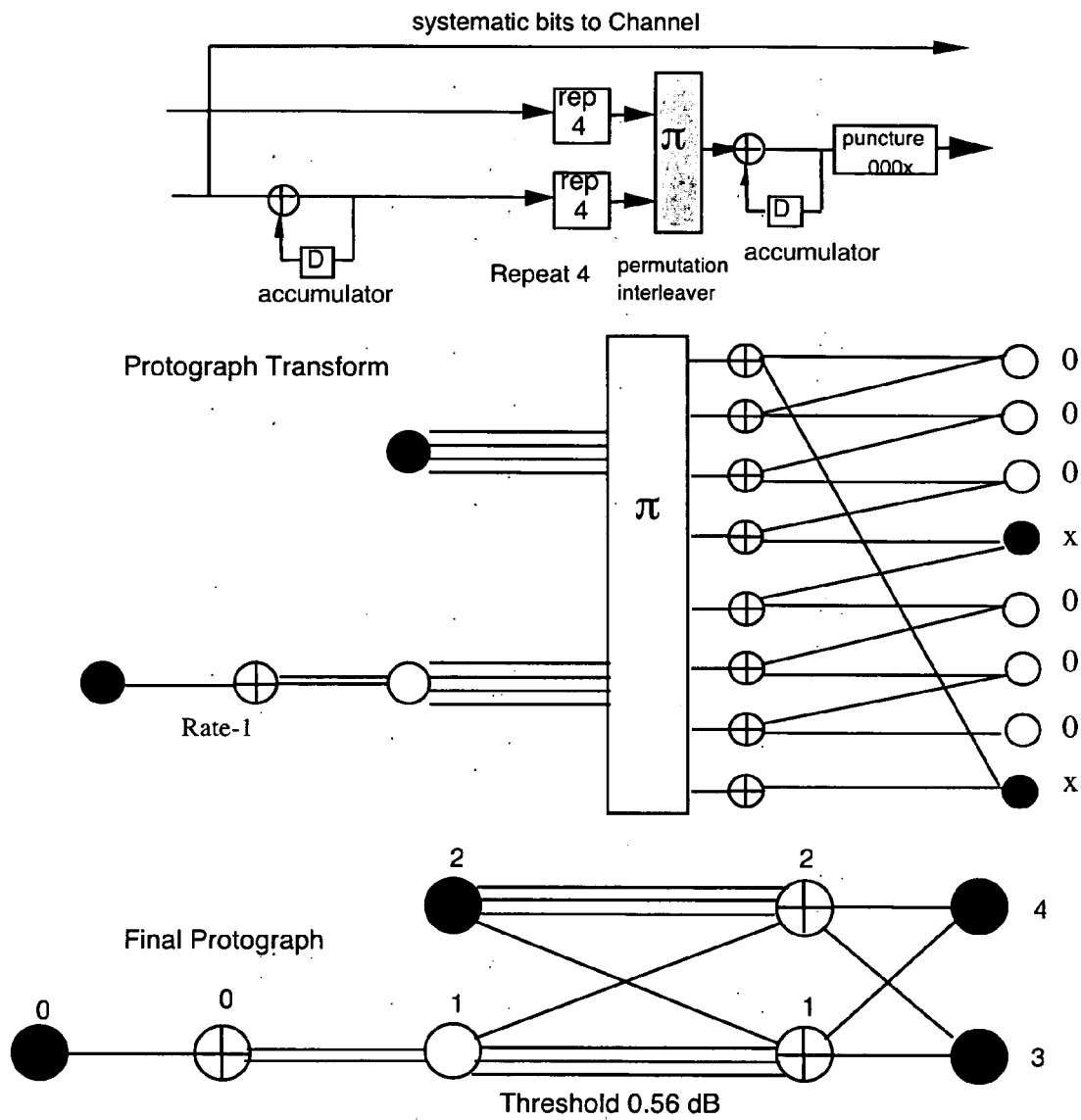
Fig.E ARA Repeat 4, Rate 1/2

Fig. F
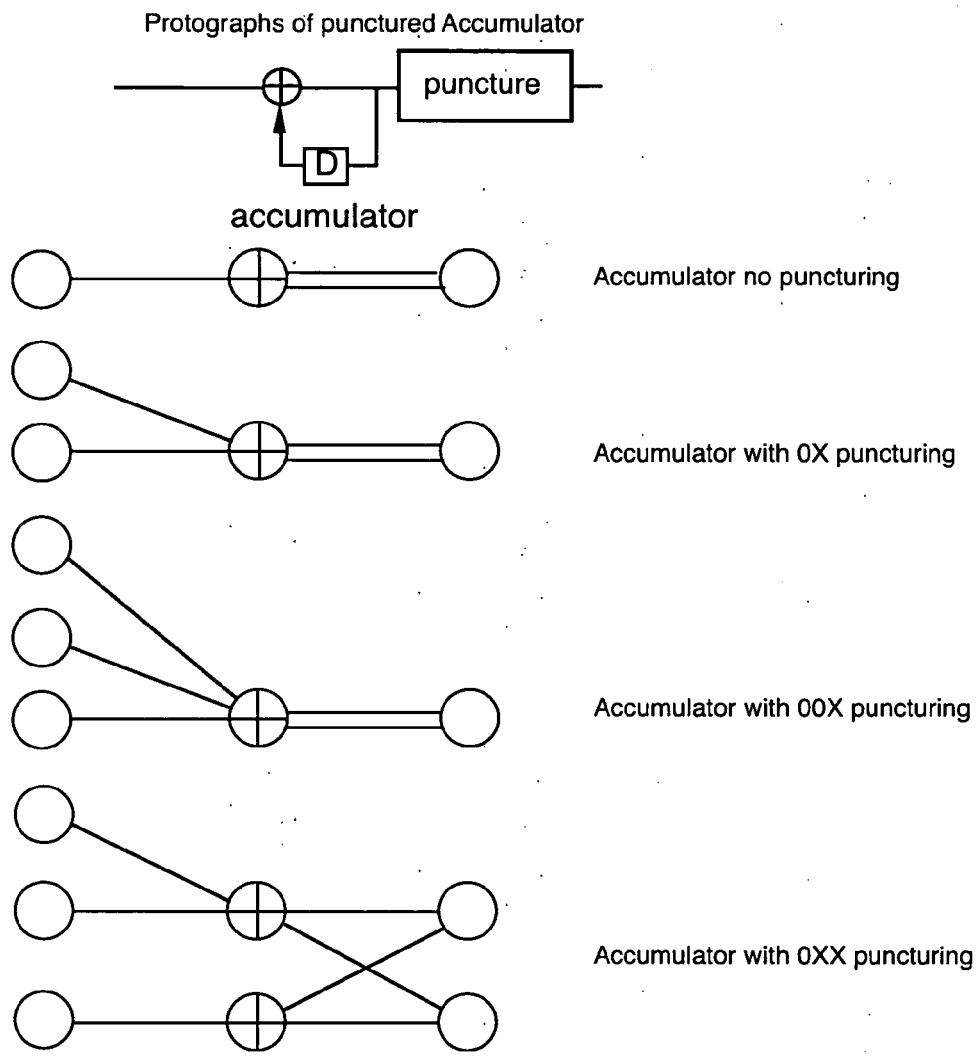

What is claimed is:

1. An encoding apparatus for linear error correcting codes, comprising:
   a precoder to precode one or more input bits;
   a repeater to repeat precoded bits for a plurality of times, forming a plurality of bits;
   an interleaver to permute the plurality of bits to form permuted bits; and
   a first accumulator to sum the permuted bits.

2. The apparatus of claim 1, wherein the repeater repeats the precoded bits in a regular manner.

3. The apparatus of claim 1, wherein the repeater repeats the precoded bits in an irregular manner.

4. The apparatus of claim 1, wherein the repeater repeats the precoded bits three times.

5. The apparatus of claim 1, wherein the repeater repeats the precoded bit four times.

6. The apparatus of claim 1, wherein the first accumulator is a punctured accumulator.

7. The apparatus of claim 6, wherein the first accumulator is a punctured accumulator having puncturing period three.

8. The apparatus of claim 1, wherein the precoder comprises a second accumulator.

9. The apparatus of claim 8, wherein the second accumulator is a punctured accumulator.

10. The apparatus of claim 9, wherein the second accumulator is a punctured accumulator having puncturing period three.

11. The apparatus of claim 1, wherein the precoder, repeater, interleaver and first accumulator are adapted to be represented by a protograph comprising parity check nodes, variable nodes representing transmitted symbols, variable nodes representing punctured symbols, and edges connecting the check nodes and the variable nodes.

12. The apparatus of claim 11, wherein the apparatus is represented by a protograph comprising:
   a first variable node representing transmitted symbols;
   a first check node;
   three edges connecting the first variable node with the first check node;
   a second variable node representing transmitted symbols; and
   two edges connecting the first check node with the second variable node.

13. The apparatus of claim 11, wherein the apparatus is represented by a protograph comprising:
   a first variable node representing transmitted symbols;
   a second variable node representing transmitted symbols;
   a first check node;
   a second check node;
   two edges connecting the first variable node with the first check node;
   two edges connecting the second variable node with the second check node;
   one edge connecting the first variable node with the second check node;
   one edge connecting the second variable node with the first check node;
   a third variable node representing transmitted symbols;
   a fourth variable node representing transmitted symbols;
   one edge connecting the first check node with the third variable node;
   one edge connecting the first check node with the fourth variable node;
   one edge connecting the second check node with the third variable node; and
   one edge connecting the second check node with the fourth variable node.

14. The apparatus of claim 11, wherein the apparatus is represented by a protograph comprising:
   a first variable node representing transmitted symbols;
   a first check node;
   one edge connecting the first variable node with the first check node;
   a second variable node representing transmitted symbols;
   one edge connecting the first check node with the first variable node;
   a third variable node representing punctured symbols;
   two edges connecting the first check node with the third variable node;
   a second check node;
   a third check node;
   two edges connecting the second variable node with the second check node;
   two edges connecting the third variable node with the third check node;
   one edge connecting the second variable node with the third check node;
   one edge connecting the third variable node with the second check node;
   a fourth variable node representing transmitted symbols;
   a fifth variable node representing transmitted symbols;
   one edge connecting the second check node with the fourth variable node;
   one edge connecting the second check node with the fifth variable node;
   one edge connecting the third check node with the fourth variable node; and
   one edge connecting the third check node with the fifth variable node.

15. The apparatus of claim 14, wherein the protograph further comprises:
   one or more sixth variable nodes representing transmitted symbols;
   one or more seventh variable nodes representing transmitted symbols;
   one edge connecting each sixth variable node with the second check node;
   two edges connecting each sixth variable node with the third check node;
   one edge connecting each seventh variable node with the third check node; and
   two edges connecting each seventh variable with the second check node.

16. The apparatus of claim 14, wherein the protograph further comprises:
   one additional edge connecting the second variable node with the second check node;
   one additional edge connecting the third variable node with the third check node;
   one or more sixth variable nodes representing transmitted symbols;
   one or more seventh variable nodes representing transmitted symbols;
   one edge connecting each sixth variable node with the second check node;
   three edges connecting each sixth variable node with the third check node;
   one edge connecting each seventh variable node with the third check node; and
   three edges connecting each seventh variable with the second check node.

17. The apparatus of claim 11, wherein the apparatus is represented by a protograph comprising:
- a first variable node representing transmitted symbols;
- a first check node;
- one edge connecting the first variable node with the first check node;
- a second variable node representing transmitted symbols;
- a third variable node representing punctured symbols;
- two edges connecting the first check node with the third variable node;
- a second check node;
- a third check node;
- two edges connecting the second variable node with the second check node;
- three edges connecting the third variable node with the third check node;
- one edge connecting the second variable node with the third check node;
- one edge connecting the third variable node with the second check node;
- a fourth variable node representing transmitted symbols;
- a fifth variable node representing transmitted symbols;
- two edges connecting the second check node with the fourth variable node;
- one edge connecting the second check node with the fifth variable node;
- one edge connecting the third check node with the fourth variable node; and
- one edge connecting the third check node with the fifth variable node.

18. The apparatus of claim 17, wherein the protograph further comprises:
- one or more sixth variable nodes representing transmitted symbols;
- one or more seventh variable nodes representing transmitted symbols;
- one edge connecting each sixth variable node with the second check node;
- two edges connecting each sixth variable node with the third check node;
- one edge connecting each seventh variable node with the third check node; and
- three edges connecting each seventh variable with the second check node.

19. The apparatus of claim 17, wherein the protograph further comprises:
- one or more sixth variable nodes representing transmitted symbols;
- one or more seventh variable nodes representing transmitted symbols;
- one edge connecting each sixth variable node with the second check node;
- three edges connecting each sixth variable node with the third check node;
- one edge connecting each seventh variable node with the third check node; and
- three edges connecting each seventh variable with the second check node.

20. A digital communication encoding method comprising:
- providing one or more bits;
- precoding the one or more bits;
- repeating each precoded bit for a plurality of times, forming a plurality of bits;
- permuting the plurality of bits to form permuted bits; and
- transmitting an accumulated sum of the permuted bits.

21. The method of claim 20, wherein the accumulated sum of the permuted bits is a punctured accumulated sum.

22. The method of claim 20, wherein each precoded bit is repeated for a same amount of times.

23. The method of claim 20, wherein the precoded bits are repeated in an irregular manner.

24. The method of claim 20, wherein the precoded bits are repeated three times.

25. The method of claim 20, wherein the precoded bits are repeated four times.

26. The method of claim 20, wherein precoding the one or more bits comprises accumulating the one or more bits.

27. The method of claim 26, wherein accumulating the one or more bits comprises puncturing the one or more bits.

28. The method of claim 27, wherein puncturing the one or more bits occurs by way of a period three puncturing.

29. The method of claim 27, wherein puncturing the one or more bits occurs by way of a period four puncturing.

30. The method of claim 20, wherein said precoding, interleaving and pemuting are adapted to be represented by a protograph comprising parity check nodes, variable nodes representing transmitted symbols, variable nodes representing punctured symbols, and edges connecting the check nodes and the variable nodes.

31. The method of claim 30, wherein the method is represented by a protograph comprising:
- a first variable node representing transmitted symbols;
- a first check node;
- three edges connecting the first variable node with the first check node;
- a second variable node representing transmitted symbols; and
- two edges connecting the first check node with the second variable node.

32. The method of claim 30, wherein the method is represented by a protograph comprising:
- a first variable node representing transmitted symbols;
- a second variable node representing transmitted symbols;
- a first check node;
- a second check node;
- two edges connecting the first variable node with the first check node;
- two edges connecting the second variable node with the second check node;
- one edge connecting the first variable node with the second check node;
- one edge connecting the second variable node with the first check node;
- a third variable node representing transmitted symbols;
- a fourth variable node representing transmitted symbols;
- one edge connecting the first check node with the third variable node;
- one edge connecting the first check node with the fourth variable node;
- one edge connecting the second check node with the third variable node; and
- one edge connecting the second check node with the fourth variable node.

33. The method of claim 30, wherein the method is represented by a protograph comprising:
- a first variable node representing transmitted symbols;
- a first check node;
- one edge connecting the first variable node with the first check node;
- a second variable node representing transmitted symbols;
- one edge connecting the first check node with the first variable node;

a third variable node representing punctured symbols;
two edges connecting the first check node with the third variable node;
a second check node;
a third check node;
two edges connecting the second variable node with the second check node;
two edges connecting the third variable node with the third check node;
one edge connecting the second variable node with the third check node;
one edge connecting the third variable node with the second check node;
a fourth variable node representing transmitted symbols;
a fifth variable node representing transmitted symbols;
one edge connecting the second check node with the fourth variable node;
one edge connecting the second check node with the fifth variable node;
one edge connecting the third check node with the fourth variable node; and
one edge connecting the third check node with the fifth variable node.

34. The method of claim 33, wherein the protograph further comprises:
one or more sixth variable nodes representing transmitted symbols;
one or more seventh variable nodes representing transmitted symbols;
one edge connecting each sixth variable node with the second check node;
two edges connecting each sixth variable node with the third check node;
one edge connecting each seventh variable node with the third check node; and
two edges connecting each seventh variable with the second check node.

35. The method of claim 33, wherein the protograph further comprises:
one additional edge connecting the second variable node with the second check node;
one additional edge connecting the third variable node with the third check node;
one or more sixth variable nodes representing transmitted symbols;
one or more seventh variable nodes representing transmitted symbols;
one edge connecting each sixth variable node with the second check node;
three edges connecting each sixth variable node with the third check node;
one edge connecting each seventh variable node with the third check node; and
three edges connecting each seventh variable with the second check node.

36. The method of claim 30, wherein the method is represented by a protograph comprising:
a first variable node representing transmitted symbols;
a first check node;
one edge connecting the first variable node with the first check node;
a second variable node representing transmitted symbols;
a third variable node representing punctured symbols;
two edges connecting the first check node with the third variable node;
a second check node;
a third check node;
two edges connecting the second variable node with the second check node;
three edges connecting the third variable node with the third check node;
one edge connecting the second variable node with the third check node;
one edge connecting the third variable node with the second check node;
a fourth variable node representing transmitted symbols;
a fifth variable node representing transmitted symbols;
two edges connecting the second check node with the fourth variable node;
one edge connecting the second check node with the fifth variable node;
one edge connecting the third check node with the fourth variable node; and
one edge connecting the third check node with the fifth variable node.

37. The method of claim 36, wherein the protograph further comprises:
one or more sixth variable nodes representing transmitted symbols;
one or more seventh variable nodes representing transmitted symbols;
one edge connecting each sixth variable node with the second check node;
two edges connecting each sixth variable node with the third check node;
one edge connecting each seventh variable node with the third check node; and
three edges connecting each seventh variable with the second check node.

38. The method of claim 36, wherein the protograph further comprises:
one or more sixth variable nodes representing transmitted symbols;
one or more seventh variable nodes representing transmitted symbols;
one edge connecting each sixth variable node with the second check node;
three edges connecting each sixth variable node with the third check node;
one edge connecting each seventh variable node with the third check node; and
three edges connecting each seventh variable with the second check node.

* * * * *

UNITED STATES PATENT AND TRADEMARK OFFICE
CERTIFICATE OF CORRECTION

PATENT NO. : 7,343,539 B2 Page 1 of 1
APPLICATION NO. : 11/166040
DATED : March 11, 2008
INVENTOR(S) : Dariush Divsalar et al.

It is certified that error appears in the above-identified patent and that said Letters Patent is hereby corrected as shown below:

On the Title page, Item (73) the Assignee name to be deleted.

Signed and Sealed this

First Day of September, 2009

David J. Kappos
*Director of the United States Patent and Trademark Office*